(12) United States Patent
Kameshiro et al.

(10) Patent No.: US 7,772,053 B2
(45) Date of Patent: Aug. 10, 2010

(54) METHOD FOR FABRICATION OF SEMICONDUCTOR DEVICE

(75) Inventors: Norifumi Kameshiro, Kodaira (JP); Toshiyuki Mine, Fussa (JP); Tomoyuki Ishii, Kokubunji (JP); Toshiaki Sano, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 417 days.

(21) Appl. No.: 11/956,858

(22) Filed: Dec. 14, 2007

(65) Prior Publication Data
US 2008/0261357 A1    Oct. 23, 2008

(30) Foreign Application Priority Data
Dec. 15, 2006  (JP)  .............................. 2006-337856

(51) Int. Cl.
    H01L 21/00    (2006.01)
(52) U.S. Cl. .................. 438/164; 438/151; 438/156; 438/300
(58) Field of Classification Search .................. 438/149, 438/151, 156, 161, 164, 300
    See application file for complete search history.

(56) References Cited

U.S. PATENT DOCUMENTS

| | | | | |
|---|---|---|---|---|
| 5,393,681 A | * | 2/1995 | Witek et al. .................. 438/301 |
| 5,648,276 A | * | 7/1997 | Hara et al. ................... 438/164 |
| 6,162,688 A | * | 12/2000 | Gardner et al. .............. 438/289 |
| 6,204,100 B1 | * | 3/2001 | Kim ........................... 438/154 |
| 6,214,680 B1 | * | 4/2001 | Quek et al. .................. 438/300 |
| 6,346,447 B1 | * | 2/2002 | Rodder ....................... 438/300 |

FOREIGN PATENT DOCUMENTS

| JP | 05-190856 A | 7/1993 |
|---|---|---|
| JP | 06-021458 A | 1/1994 |

* cited by examiner

Primary Examiner—Kevin M Picardat
(74) Attorney, Agent, or Firm—Miles & Stockbridge P.C.

(57) ABSTRACT

After forming a source-drain material film on an insulator layer, an opening portion reaching the insulator layer is formed in the source-drain material film. Then, a channel having desired thickness and a gate insulator are sequentially formed on the insulator layer and the source-drain material film in the opening portion. Thereafter, a gate material film embedding the opening portion is formed on the gate insulator. Subsequently, a cap film is formed on the gate material film, thereby forming the gate made of the gate material film. Then, a mask layer is formed on the source-drain material film. Next, the source-drain material film not protected by the mask layer is removed while protecting the gate by the cap film, thereby leaving the source-drain material film on both sides of the gate. The source-drain material film on one side becomes the source and that on the other side becomes the drain.

8 Claims, 27 Drawing Sheets

METHOD FOR FABRICATION OF SEMICONDUCTOR DEVICE

CROSS-REFERENCE TO RELATED APPLICATION

The present application claims priority from Japanese Patent Application No. JP 2006-337856 filed on Dec. 15, 2006, the content of which is hereby incorporated by reference into this application.

TECHNICAL FIELD OF THE INVENTION

The present invention relates to a technology for the fabrication of a semiconductor device. More particularly, it relates to a technology effectively applied to a semiconductor device provided with a thin-film transistor.

BACKGROUND OF THE INVENTION

A thin-film transistor (TFT) is one type of field effect transistor (FET), and it is basically constituted of three terminals of a gate, a drain and a source and is mainly used for a liquid crystal display. Further, the thin-film transistor is also used for a semiconductor device mounted together with a normal MIS (metal insulator semiconductor) transistor, for example, an SRAM (static random access memory) and a DRAM (dynamic RAM).

Japanese Patent Application Laid-Open Publication No. 5-190856 (Patent Document 1) and Japanese Patent Application Laid-Open Publication No. 6-21458 (Patent Document 2) describe that, when a thin-film transistor is used for a memory cell of an SRAM, the off current of the thin-film transistor affects the standby current of the SRAM, and it is effective for the reduction of the standby current to reduce the thickness of a channel of the thin-film transistor. Further, the Patent Documents 1 and 2 describe a thin-film transistor constituted of the three terminals of a source, a drain and a gate formed on an insulator layer and a channel formed on the gate via a gate insulator. The thickness of the channel is thinner than that of the source and the drain.

SUMMARY OF THE INVENTION

With the progress in the miniaturization of elements, the number of MIS (metal insulator semiconductor) transistors that can be mounted on the same chip has been increased and it becomes possible to form more advanced and higher-performance semiconductor device.

Incidentally, when a thin-film transistor is mounted together with a normal MIS transistor, it can be formed on an isolation region (insulator layer). Therefore, the effective reduction in the circuit area and the memory area can be expected. Further, as is typical in a liquid crystal display, the thin-film transistor can be formed not only on a semiconductor substrate but also on an insulating glass substrate.

Accordingly, much emphasis has been placed on the thin-film transistor formed on an insulator layer more than ever, and the technology for forming high-performance thin-film transistor has been demanded.

FIG. 27 is a cross-sectional view showing the structure of the thin-film transistor examined by the inventors of the present invention. This thin-film transistor is formed on an insulator layer 106 and has a gate 101, a source 102, a drain 103, a channel 104 and a gate insulator 105. On the insulator layer 106, the source 102, the drain 103 and the channel 104 formed from the same polysilicon film are provided, and the channel 104 is disposed between the source 102 and the drain 103. On this channel 104, the gate 101 is provided via the gate insulator 105. Note that contacts 108 are electrically connected to the gate 101, the source 102 and the drain 103, respectively.

In the thin-film transistor shown in FIG. 27, since the impurity implantation for forming the source 102 and the drain 103 is performed using the gate 101 as a mask, the fabrication process is simple. Also, in order to improve the performance of the elements, that is, to reduce the leakage current and others, the impurity implantation for the so-called LDD structure is performed in some cases.

As a method of reducing the off current of the thin-film transistor, the reduction of the channel thickness is quite effective.

In the thin-film transistor shown in FIG. 27, the source 102, the drain 103, and the channel 104 are formed from the same polysilicon film. Therefore, in order to reduce the thickness of the channel 104, the thickness of the source 102 and the drain 103 has to be reduced at the same time. However, if the thickness of the source 102 and the drain 103 is reduced, various problems occur, such as the resistance increase, the penetration in forming the contact holes and others. Accordingly, the polysilicon film is formed to have the thickness of about 50 nm or more.

Therefore, in order to reduce the thickness of the channel, the method of forming the channel separately from the source and the drain is proposed.

FIG. 28 and FIG. 29 are cross-sectional views each showing the structure of a thin-film transistor in which the channel 104 is thinner than the source 102 and the drain 103.

In the thin-film transistor shown in FIG. 28, for example, by using the technology of the Patent Document 1, the source 102, the drain 103 and the gate 101 are processed in advance, and then, the channel 104 is separately formed. By this means, the thickness of only the channel 104 can be reduced. Alternatively, in the thin-film transistor as shown in FIG. 29, by using the technology of the Patent Document 2, after processing the source 102, the drain 103 and the gate 101, the space portions are embedded with an insulator layer 107 to reduce the difference in level, and then, the channel 104 is separately formed. By this means, the thickness of only the channel 104 can be reduced.

However, in the thin-film transistor with the structure as shown in FIG. 28 and FIG. 29, in order to leave the gate insulator 105 only for the gate 101, the gate insulator 105 has to be directly processed using a mask. Accordingly, the problem of the degradation in reliability due to the variation in thickness of the gate insulator 105 is caused. Further, because of the lower gate, space portions have to be formed on both sides of the gate 101. Also, a pad has to be extended so as to form a contact to the gate 101, which prevents the size reduction of the element.

An object of the present invention is to provide the technology capable of forming a thin-film transistor having a thin channel.

The above and other objects and novel characteristics of the present invention will be apparent from the description of this specification and the accompanying drawings.

The typical ones of the inventions disclosed in this application will be briefly described as follows.

In a method for fabrication of a semiconductor device according to the present invention, first, after forming a source-drain material film on an insulator layer, an opening portion reaching the insulator layer is formed in the source-drain material film. Subsequently, after sequentially forming a semiconductor film with a desired thickness and a gate insulator on the insulator layer in the opening portion and on the source-drain material film in the opening portion, a gate material film embedding the opening portion is formed on the gate insulator. Then, a cap film is formed on the gate material film, thereby forming a gate made of the gate material film. Next, a mask layer is formed on the source-drain material film. Then, the source-drain material film not protected by the mask layer is removed while protecting the gate by the cap film, thereby leaving the source-drain material film on both sides of the gate. The source-drain material film on one side of the gate becomes a source, and the source-drain material film on the other side thereof becomes a drain.

The effects obtained by typical aspects of the present invention will be briefly described below.

According to the fabrication technology of a semiconductor device of the present invention, it is possible to form a thin-film transistor having a thin channel made of a semiconductor film with a desired thickness.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted. In particular, the components having corresponding functions in difference embodiments are denoted by the same reference symbols even though they differ in shape, impurity concentration and crystallinity. Further, hatching is used in some cases even in a plan view so as to make the drawings easy to see.

In the following embodiments, a gate, a gate electrode and a gate region are collectively referred to as "gate", a source, a source electrode and a source region are collectively referred to as "source", and a drain, a drain electrode and a drain region are collectively referred to as "drain".

Further, in the present invention, a memory, a semiconductor memory and a memory cell (unit memory cell) are collectively referred to as "memory". Note that, although the memory includes an SRAM, a flash memory, an EEPROM (electronically erasable and programmable read only memory) and others, the "memory" indicates a memory having a gain cell structure in the present invention unless otherwise stated.

First Embodiment

FIG. 1 is an explanatory diagram showing an upper surface structure and a cross-sectional structure of a semiconductor device according to the first embodiment of the present invention. The semiconductor device according to the first embodiment is a so-called thin-film transistor. Note that, in order to avoid the complication in the description of the device structure, the sidewalls, the wiring layers and others are not shown in the semiconductor device in FIG. 1.

Figure 1A:
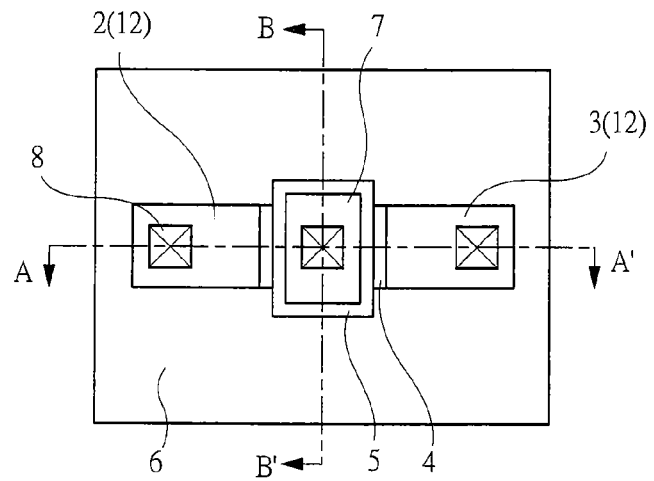
FIG. 1A is a top view showing an example of a semiconductor device according to the first embodiment of the present invention.
Figure 1B:
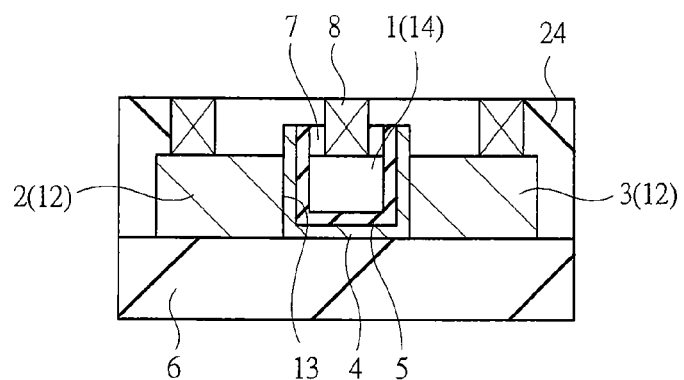
FIG. 1B is a cross-sectional view showing the cross section taken along the line A-A' in FIG. 1A.
Figure 1C:
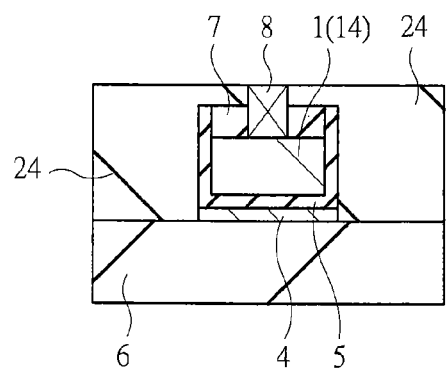
FIG. 1C is a cross-sectional view showing the cross section taken along the line B-B' in FIG. 1A.
Figure 2A:
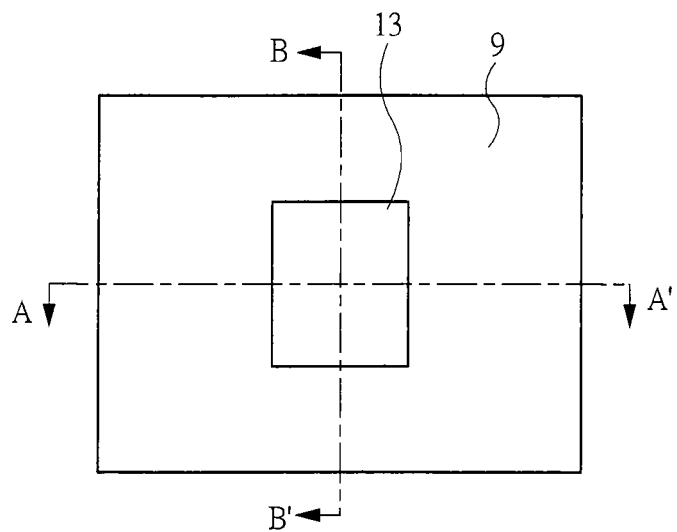
FIG. 2A is a top view showing a fabrication process of a semiconductor device according to the first embodiment of the present invention.
Figure 2B:
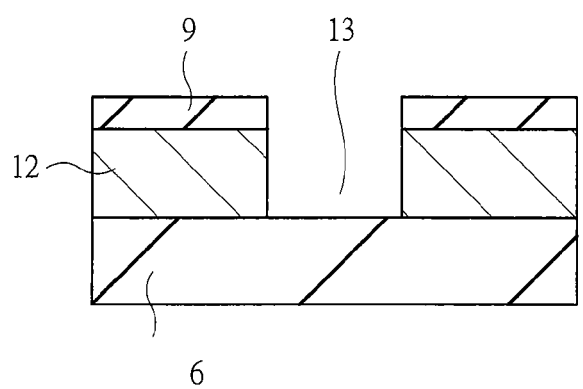
FIG. 2B is a cross-sectional view showing the cross section taken along the line A-A' in FIG. 2A.
Figure 2C:
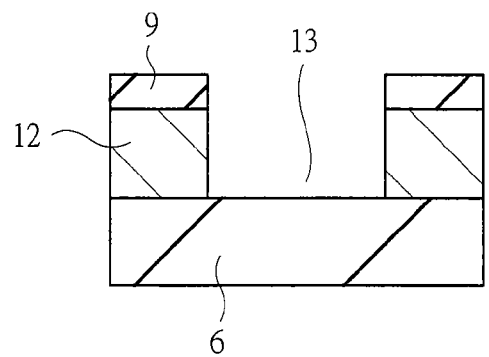
FIG. 2C is a cross-sectional view showing the cross section taken along the line B-B' in FIG. 2A.

First, the structure of the semiconductor device according to the first embodiment will be described with reference to FIG. 1. FIG. 1A is a top view, FIG. 1B is a cross-sectional view showing the cross section taken along the line A-A' in FIG. 1A, and FIG. 1C is a cross-sectional view showing the cross section taken along the line B-B' in FIG. 1A. Note that, in the top view in FIG. 1A, the illustration of an interlayer insulator 24 is omitted so as to make the positional relations of the respective components easily understood.

In the semiconductor device according to the first embodiment, a source 2 and a drain 3 made of, for example, an n type polysilicon film are formed on an insulator layer 6 made of a silicon oxide film on a semiconductor substrate. Further, a channel 4 made of a semiconductor film, for example, an intrinsic polysilicon film with a thickness of about 2.5 nm is formed on the insulator layer 6 and between the source 2 and the drain 3. Further, a gate insulator 5 made of a silicon oxide film with a thickness of about 15 nm is formed on the channel 4. Also, a gate 1 made of, for example, an n type polysilicon film which is electrically isolated from the source 2, the drain 3 and the channel 4 via the gate insulating film 5 and controls the potential of the channel 4 is formed on the insulator layer 6 and between the source 2 and the drain 3. Further, a cap film 7 made of, for example, a silicon oxide film is formed on the upper surface of the gate 1. Also, in a direction which intersects with the direction where current flows from the source 2 to the drain 3 through the channel 4, the size of the gate 1 is larger than those of the source 2 and the drain 3, and the channel 4 is formed on the whole lower surface of the gate 1.

Further, an interlayer insulator 24 is formed so as to cover the source 2, the drain 3 and the gate 1. Also, a contact 8 is connected to each of the gate 1, the source 2 and the drain 3. Alternatively, the gate 1 can be made of metal or silicide and at least one of the source 2 and the drain 3 can be made of metal or silicide. Further, the channel 4 can be made of a semiconductor film such as a single crystal silicon film or an amorphous silicon film.

In the thin-film transistor described in the first embodiment, since the thickness of the channel can be controlled by means of deposition, it is possible to form the channel thinly. Therefore, it is possible to reduce the off current of the thin-film transistor. In particular, when the channel thickness is reduced to about 5 nm or less, the remarkable effect in reduction of the leakage current can be achieved. Compared with the leakage current in an off state (off current) of a normal transistor which is about $10^{-10}$ to $10^{-15}$ A, the leakage current can be reduced to about $10^{-19}$ A in the thin-film transistor having the channel thickness of about 5 nm or less owing to the quantum-confinement effect in a thickness direction. However, in the case where the on current of the thin-film transistor is to be increased, the channel having larger thickness can be used. In other words, since the thickness of the source and the drain and that of the channel can be independently set, the thickness of the channel can be set to an optimum value so that the necessary channel current can be obtained without increasing the resistance of the source and the drain.

Since the thin-film transistor described in the first embodiment has a structure in which the gate 1 is embedded in an opening portion (hole), unnecessary spaces are not provided between the source 2 and the gate 1 and between the drain 3 and the gate 1. Also, since the contact 8 is formed for the gate 1, it is not necessary to extend the pad, and thus, the size of the element can be reduced.

Next, the fabrication process of a semiconductor device according to the first embodiment will be described. FIG. 2 to FIG. 9 are top views and cross-sectional views in each step for fabricating the thin-film transistor according to the first embodiment. In FIG. 2 to FIG. 9, FIG. 2A to FIG. 9A are top views, FIG. 2B to FIG. 9B are cross-sectional views showing the cross sections taken along the line A-A' in FIG. 2A to FIG. 9A, and FIG. 2C to FIG. 9C are cross-sectional views showing the cross sections taken along the line B-B' in FIG. 2A to FIG. 9A.

Note that, in order to avoid the complication in the description, only the positions of the main components in the corresponding step are shown in the top views, and thus, the top views do not represent the accurate top views. Further, each of the cross-sectional views illustrates the upper structure above the insulator layer on which the semiconductor device is to be formed. This insulator layer is, for example, a silicon oxide film formed on a semiconductor substrate or a glass substrate.

First, as shown in FIG. 2, a source-drain material film 12 and a stopper layer 9 are sequentially formed in this order on an insulator layer 6 on the semiconductor substrate. Thereafter, an opening portion 13 reaching the insulator layer 6 is formed in the stopper film 9 and the source-drain material film 12.

More concretely, after the insulator layer 6 made of a silicon oxide film is formed on the whole surface of the semiconductor substrate made of p type single crystal silicon by CVD (chemical vapor deposition) or thermal oxidation, the source-drain material film 12 made of an undoped polysilicon film is formed to about 150 nm by, for example, CVD. Subsequently, after the stopper layer 9 made of a silicon nitride film with a thickness of about 50 nm is deposited on the source-drain material film 12, the etching using a hole pattern of a resist as a mask is performed to remove the source-drain material film 12 in the channel and gate region, thereby forming the opening portion 13.

Figure 3A:
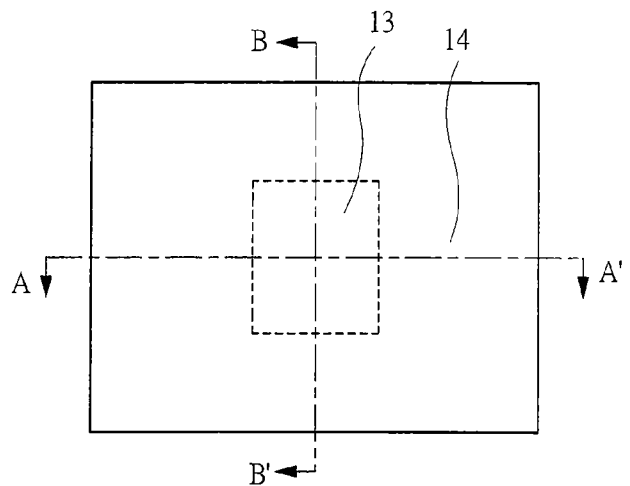
FIG. 3A is a top view showing the fabrication process of a semiconductor device continued from FIG. 2A.
Figure 3B:
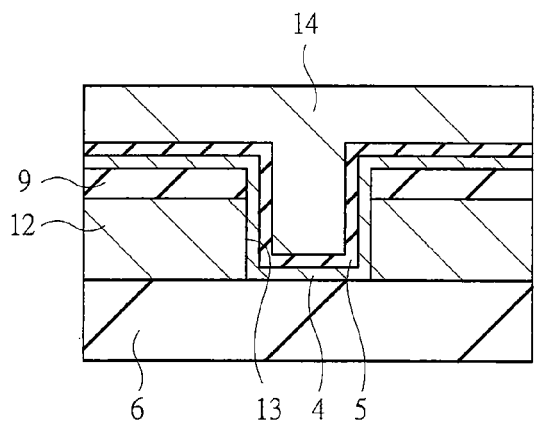
FIG. 3B is a cross-sectional view showing the fabrication process of a semiconductor device continued from FIG. 2B.
Figure 3C:
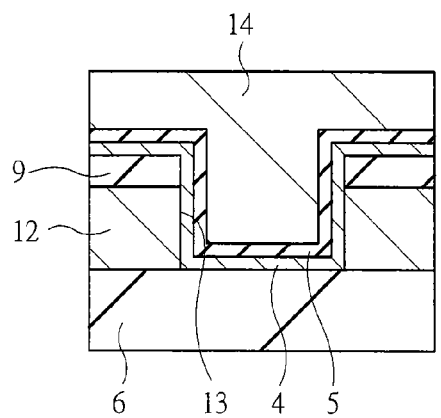
FIG. 3C is a cross-sectional view showing the fabrication process of a semiconductor device continued from FIG. 2C.

Subsequently, as shown in FIG. 3, after the channel 4 with a desired thickness and the gate insulator 5 are sequentially formed in this order on the insulator layer 6 in the opening portion 13 and on the source-drain material film 12 in the opening portion 13, a gate material film 14 embedding the opening portion 13 is formed on the gate insulator 5.

More concretely, after the cleaning of the substrate, the channel 4 made of an amorphous silicon film with a thickness of about 2.5 nm, the gate insulator 5 made of a silicon oxide film with a thickness of about 15 nm and the gate material film 14 made of an n type polysilicon film with a thickness of about 200 nm are deposited by, for example, CVD. Then, by performing the annealing, the amorphous silicon film of the channel 4 is crystallized to be a polysilicon film.

Note that the unique examination by the inventors of the present invention has revealed that the temperature higher than the temperature for forming the thickness of about 10 nm or more, that is, about 900° C. is necessary for the crystallization of the ultra-thin channel 4 described above. Since impurities are not implanted into the source-drain material film 12 to be the source 2 and the drain 3 of the thin-film transistor at this annealing step, no adverse effect is given to the short-channel characteristics of the thin-film transistor.

Figure 4A:
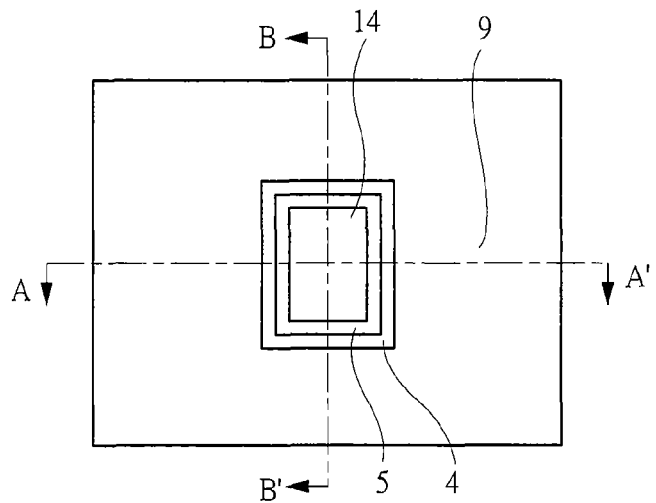
FIG. 4A is a top view showing the fabrication process of a semiconductor device continued from FIG. 3A.
Figure 4B:
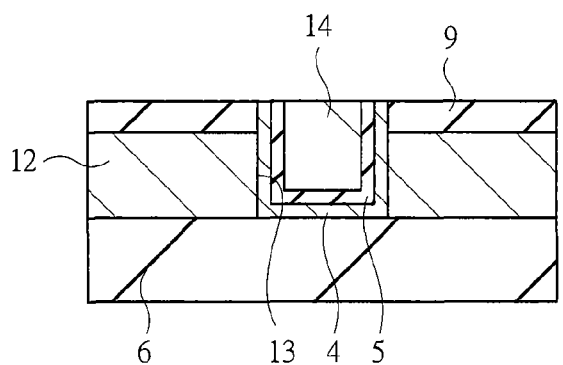
FIG. 4B is a cross-sectional view showing the fabrication process of a semiconductor device continued from FIG. 3B.
Figure 4C:
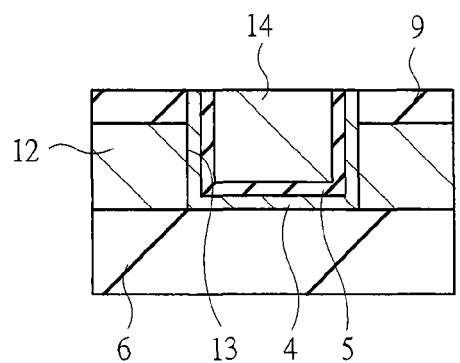
FIG. 4C is a cross-sectional view showing the fabrication process of a semiconductor device continued from FIG. 3C.

Subsequently, as shown in FIG. 4, the gate material film 14 is removed by CMP (chemical mechanical polishing) or etching back, and the removal is stopped when the surface of the stopper layer 9 is exposed. By this means, the gate material film 14 made of an n type polysilicon film is left only in the opening portion 13 of the hole pattern formed previously.

Figure 5A:
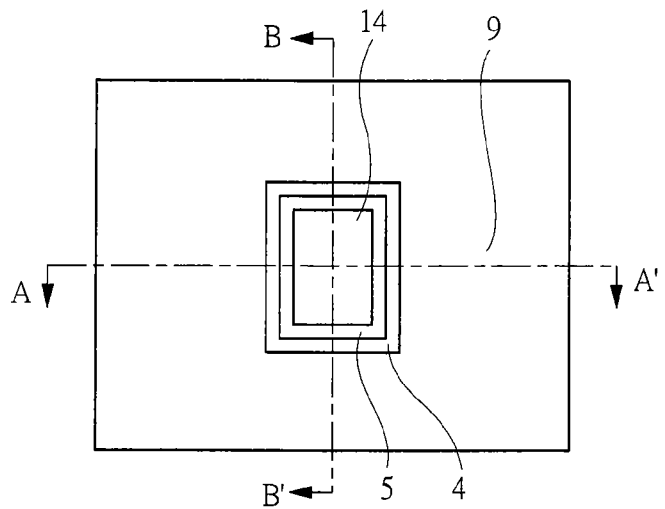
FIG. 5A is a top view showing the fabrication process of a semiconductor device continued from FIG. 4A.
Figure 5B:
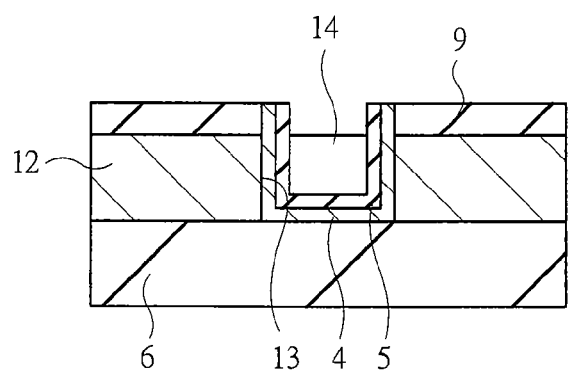
FIG. 5B is a cross-sectional view showing the fabrication process of a semiconductor device continued from FIG. 4B.
Figure 5C:
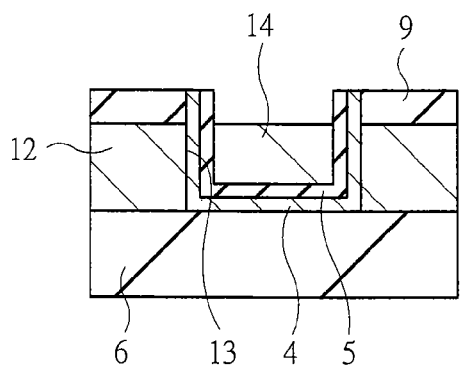
FIG. 5C is a cross-sectional view showing the fabrication process of a semiconductor device continued from FIG. 4C.

Next, as shown in FIG. 5, the gate material film 14 is etched back to be recessed below the surface of the stopper layer 9, thereby controlling the height thereof to a desired one. The left gate material film 14 becomes the gate 1 of the thin-film transistor.

Figure 6A:
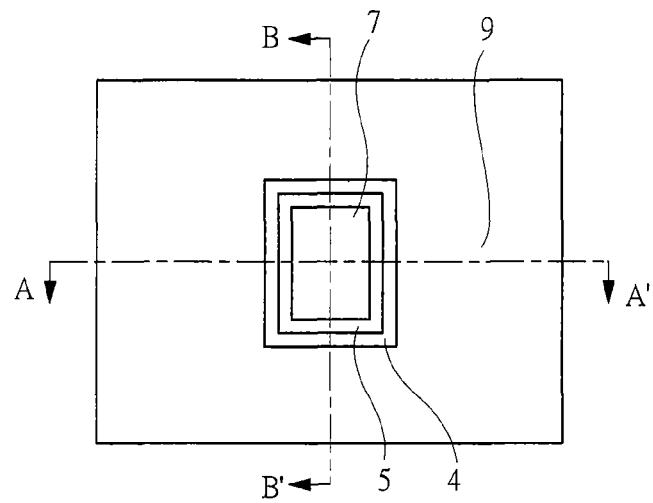
FIG. 6A is a top view showing the fabrication process of a semiconductor device continued from FIG. 5A.
Figure 6B:
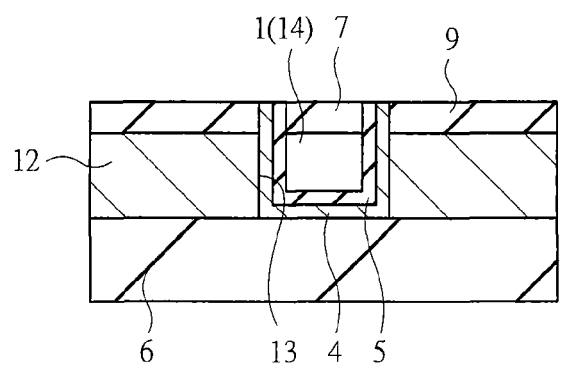
FIG. 6B is a cross-sectional view showing the fabrication process of a semiconductor device continued from FIG. 5B.
Figure 6C:
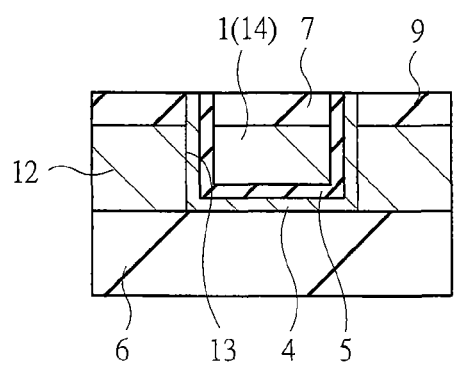
FIG. 6C is a cross-sectional view showing the fabrication process of a semiconductor device continued from FIG. 5C.

Subsequently, as shown in FIG. 6, the cap film 7 is formed on the gate material film 14, thereby forming the gate 1 made of the gate material film.

More concretely, a silicon oxide film with a thickness of about 100 nm by, for example, CVD so as to cover the gate material film 14, and the silicon oxide film is removed by CMP and the removal is stopped when the surface of the stopper layer 9 is exposed. By this means, the cap film 7 made of a silicon oxide film is formed.

Figure 7A:
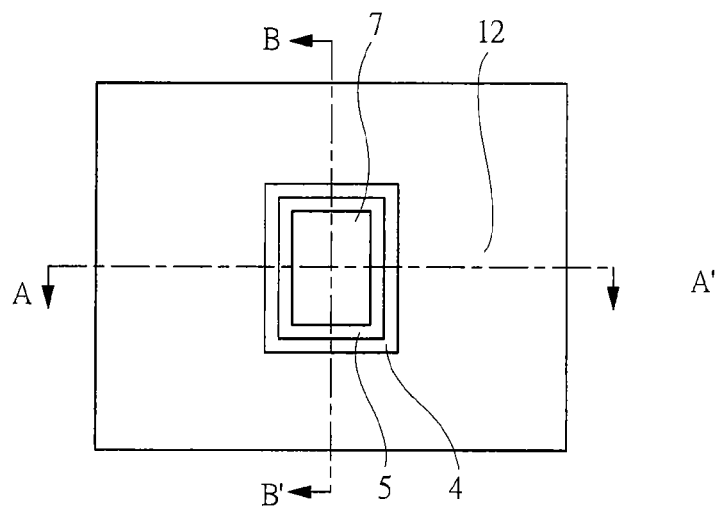
FIG. 7A is a top view showing the fabrication process of a semiconductor device continued from FIG. 6A.
Figure 7B:
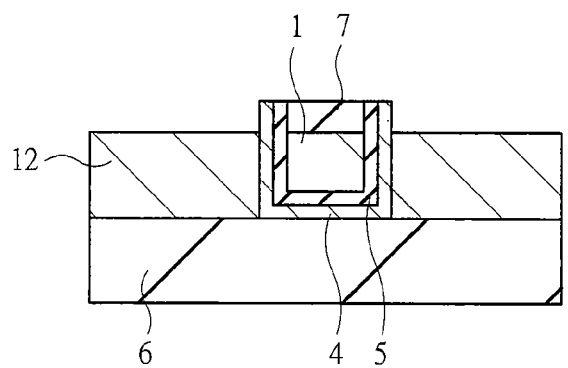
FIG. 7B is a cross-sectional view showing the fabrication process of a semiconductor device continued from FIG. 6B.
Figure 7C:
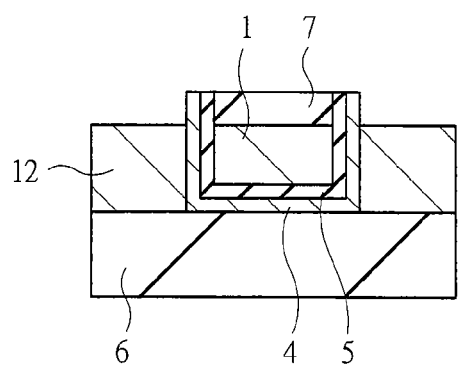
FIG. 7C is a cross-sectional view showing the fabrication process of a semiconductor device continued from FIG. 6C.

Then, as shown in FIG. 7, the stopper layer 9 is removed by etching. At this time, the gate 1 is protected by the cap film 7. In this case, the silicon nitride film is etched more in accordance with difference in the etching selectivity ratio between a silicon oxide film and a silicon nitride film.

Next, impurities are implanted into the regions to be n type source and drain and regions to be p type source and drain of the polysilicon film, with using a resist as a mask. In this case, since the source and drain of the thin-film transistor are formed to be n type, an n type impurity is implanted into the source-drain material film 12.

Figure 8A:
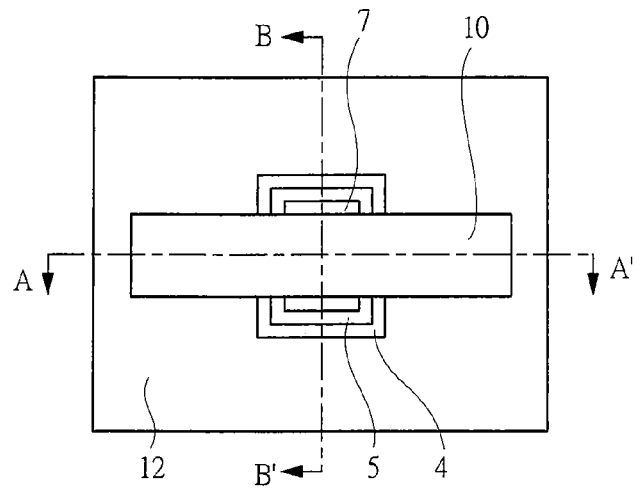
FIG. 8A is a top view showing the fabrication process of a semiconductor device continued from FIG. 7A.
Figure 8B:
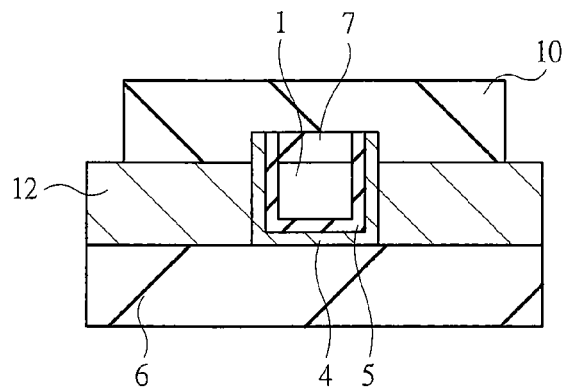
FIG. 8B is a cross-sectional view showing the fabrication process of a semiconductor device continued from FIG. 7B.
Figure 8C:
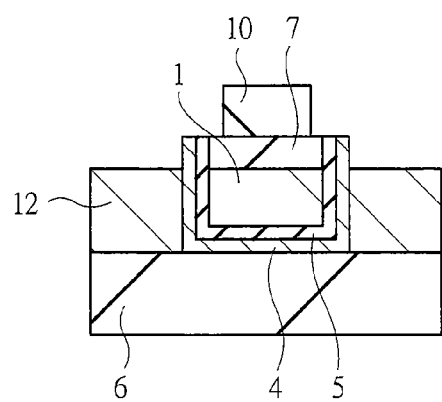
FIG. 8C is a cross-sectional view showing the fabrication process of a semiconductor device continued from FIG. 7C.
Figure 9A:
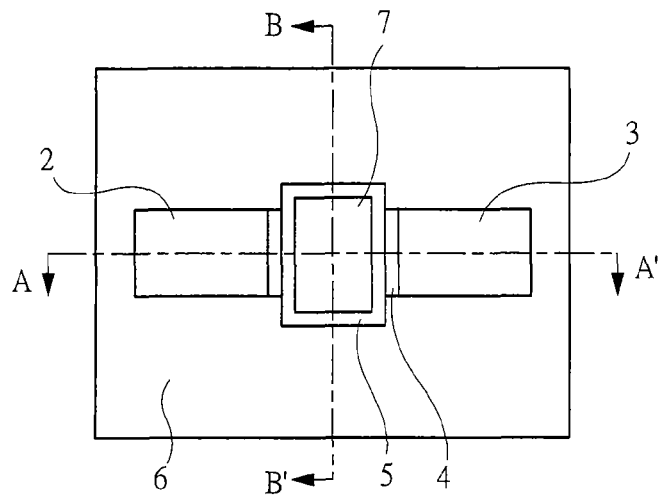
FIG. 9A is a top view showing the fabrication process of a semiconductor device continued from FIG. 8A.
Figure 9B:
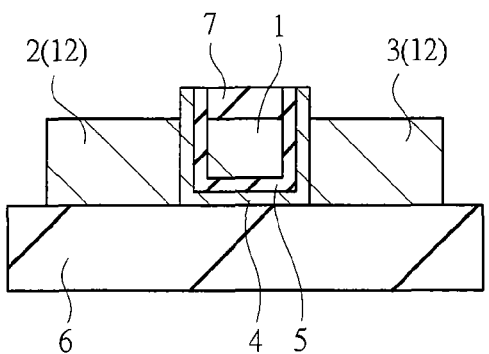
FIG. 9B is a cross-sectional view showing the fabrication process of a semiconductor device continued from FIG. 8B.
Figure 9C:
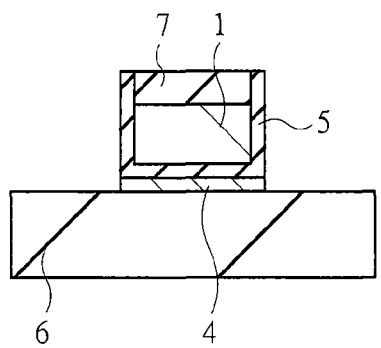
FIG. 9C is a cross-sectional view showing the fabrication process of a semiconductor device continued from FIG. 8C.

Subsequently, as shown in FIG. 8, a mask layer 10 is formed on the gate 1 and the source-drain material film 12 so as to pass across the gate 1.

More concretely, in order to leave the source-drain material film 12 so as to form the source 2 on one side of the gate 1 and the drain 3 on the other side of the gate 1, the mask layer 10 made of resist is formed on the gate 1 and the source-drain material film 12 so as to pass across the gate 1.

Subsequently, while protecting the gate 1 by the cap film 7, the source-drain material film 12 not protected by the mask layer 10 is removed. By this means, as shown in FIG. 9, the source-drain material film 12 is left on both sides of the gate 1.

More concretely, the source-drain material film 12 made of a polysilicon film is etched using a resist as a mask. At this time, for example, with using the mask layer 10 made of a resist as shown in FIG. 8, the source 2 and the drain 3 of the thin-film transistor are formed from the source-drain material film 12 as shown in FIG. 9. In this case, since the gate 1 of the thin-film transistor is protected by the cap film 7 made of a silicon oxide film, it is not removed.

Subsequently, after the interlayer insulator 24 made of, for example, a silicon oxide film is deposited, the step of planarizing the interlayer insulator 24, the step of forming the contact holes 8 and the step of forming the wirings are performed, whereby the semiconductor device as shown in FIG. 1 is completed.

As described above, in the fabrication process of a thin-film transistor according to the first embodiment, the channel 4 can be thinly formed by controlling the thickness of the channel 4 by means of deposition. Further, the step by which the channel 4 is broken due to the change in thickness, for example, the oxidation treatment is not included in the process after forming the channel 4. Therefore, the off current of the thin-film transistor can be reduced.

Also, since the thin-film transistor according to the first embodiment has a structure in which the gate 1 is embedded inside the opening portion, unnecessary spaces are not provided between the source 2 and the gate 1 and between the drain 3 and the gate 1. Also, since the contact 8 is formed for the gate 1, it is not necessary to extend the pad, and thus, the size of the element can be reduced.

In the first embodiment, the case where the thin-film transistor is of an n type has been described. However, the present invention can be applied to a p type thin-film transistor. In such a case, the gate material film 14 to be the gate 1 is formed as a p type polysilicon film, and a p type impurity is implanted into the source-drain material film 12 to be the source 2 and the drain 3.

Also, in the first embodiment, an amorphous silicon film of the channel 4 is crystallized by performing the annealing to form a polysilicon film. However, the amorphous silicon film can be used for the channel 4 without performing the annealing. In this case, since the annealing is not performed, when the channel 4 is mounted together with other elements on the same substrate, elements with a low heat resistance can be easily applied. Also, this case is also suitable for the case where a material with a low heat resistance, for example, a glass substrate is used for the substrate itself.

In addition, in the first embodiment, an n type polysilicon film is applied to the source 2, the drain 3 and the gate 1 and a silicon oxide film is applied to the gate insulator 5. However, even in the case where a polysilicon film or metal whose surface is silicided is used for the gate and a high dielectric constant material such as hafnium oxide and alumina is applied to the gate insulator, the above-described combination of the source 2, the drain 3 and the gate 1 and the gate insulator 5 remains effective. The relationship in thickness of the gate insulator 5 in this case should be interpreted by replacing the thickness with an electrically equivalent oxide thickness instead of the physical thickness. Also, a further reduced thickness can be used as the thickness of the gate insulator 5 as long as it is in the range where the acceptable gate leakage and reliability can be achieved.

Also, in the first embodiment, a silicon nitride film is used for the stopper layer 9. However, any material can be applied as long as it can function as a stopper when the source-drain material film 12 is processed and when the cap film 7 is processed. Further, the stopper layer 9 does not have to be a single film, but it can have a stacked structure of, for example, a silicon oxide film and a silicon nitride film.

Also, in the first embodiment, a silicon oxide film is applied to the cap film 7. However, any material can be applied as long as it can function as a mask when the source-drain material film 12 is processed. For example, a high dielectric constant material such as hafnium oxide and alumina can be applied and a conductive film such as cobalt and nickel and silicides thereof can be also applied. Note that, in the case where a conductive film is used for the cap film 7, it is not always necessary that the contact 8 for the gate 1 is penetrated through the cap film 7 and connected to the gate 1.

Also, in the first embodiment, a normal semiconductor substrate made of p type single crystal silicon is used as the substrate. However, it is apparent that an n type single crystal silicon substrate and an SOI (silicon on insulator) substrate can be used. Furthermore, since the elements are formed on the insulator layer 6, a glass substrate is also available. Also in this case, similar to the case of using a semiconductor substrate, after the source-drain material film 12 is deposited on the surface of the insulator layer 6 and a silicon nitride film to be the stopper layer 9 is deposited on the source-drain material film 12, an opening portion (hole) for forming the gate 1 of the thin-film transistor of the first embodiment is formed, whereby the structure equal to that of FIG. 2 can be obtained. As the following steps, the steps similar to those described with reference to FIG. 3 to FIG. 9 are performed.

Second Embodiment

In the second embodiment, a semiconductor device provided with a memory having a so-called gain cell structure as shown in FIG. 10 will be described. Note that, in this semiconductor device, the thin-film transistor described in the first embodiment is mounted together with a logic transistor and a high-withstand-voltage transistor formed on the same substrate.

As shown in FIG. 10, in the structure of the memory cell, basically, a write transistor M1 which writes information and a storage transistor 2 which stores information are integrated.

Figure 10A:
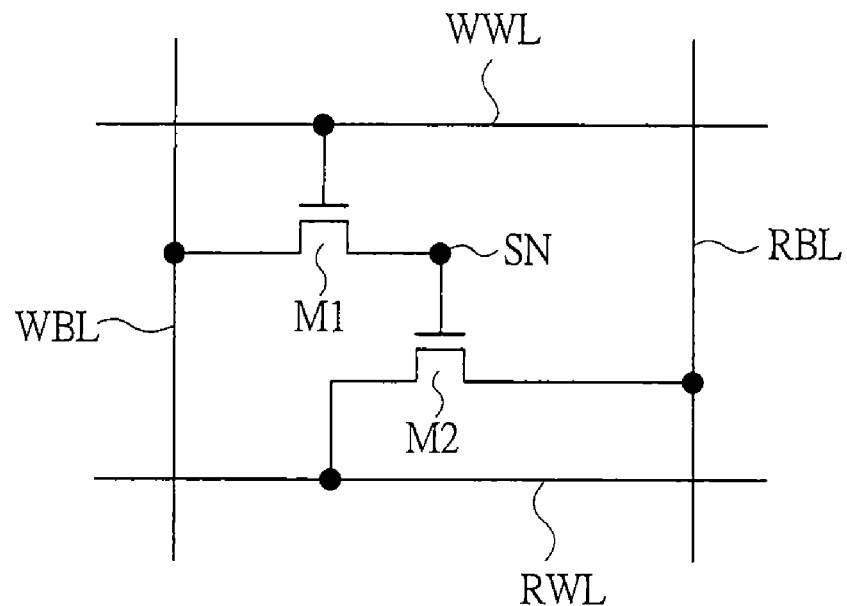
FIG. 10A is an equivalent circuit diagram showing the connecting relation of a memory using a semiconductor device and a wiring in a two-transistor structure according to the second embodiment of the present invention.

In the memory cell shown in FIG. 10A, when a voltage is applied to a gate of the write transistor M1 electrically connected to a write word line WWL to put the write transistor M1 into a conduction state, a current flows through the channel of the write transistor M1. At this time, a different amount of charge is stored in a storage node SN depending on a potential of a write bit line WBL set in advance. In other words, information is stored in the memory cell.

Meanwhile, in a storage transistor M2, a gate voltage differs depending on the amount of stored charge, and the information can be read by sensing the difference in gate voltage. More specifically, the conductance of the storage transistor M2 is changed by the change of the gate voltage, and it is extracted to the outside of the memory cell as the difference in current flowing from a read bit line RBL to a read word line RWL.

Figure 10B:
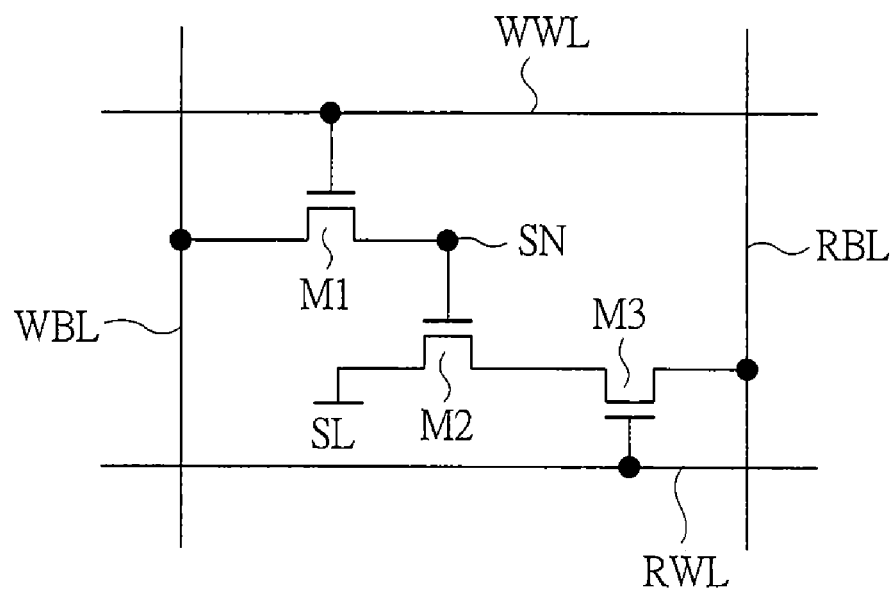
FIG. 10B is an equivalent circuit diagram showing the connecting relation of a memory using a semiconductor device and a wiring in a three-transistor structure according to the second embodiment of the present invention.

The memory cell structure shown in FIG. 10B is different from that shown in FIG. 10A in that a select transistor M3 is provided. Therefore, the conductance of the storage transistor M2 is changed by the change in the gate voltage, and it is extracted to the outside of the memory cell as the difference in current flowing from the read bit line RBL to a source line SL.

In the semiconductor device according to the second embodiment, the structure of the thin-film transistor is basically identical to that of the first embodiment described above. This thin-film transistor is used for the write transistor M1 of the memory having the gain cell structure.

The application to the three-transistor memory cell shown in FIG. 10B will be described below. In this case, since the transistors constituting the memory cell other than the thin-film transistor are normal MIS transistors formed on a semiconductor substrate, the number of transistors can be appropriately set in the design process like in the two-transistor memory cell shown in FIG. 10A depending on an application such as the area reduction.

Figure 11A:
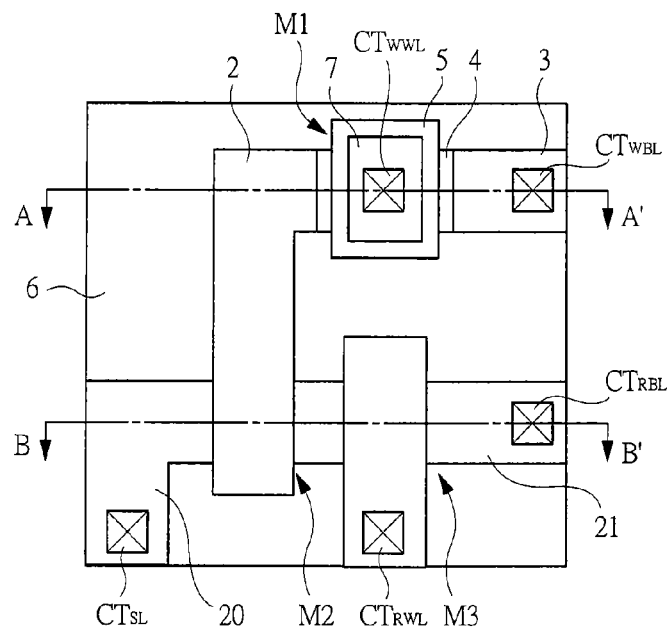
FIG. 11A is a top view showing an example of a semiconductor device according to the second embodiment of the present invention.
Figure 11B:
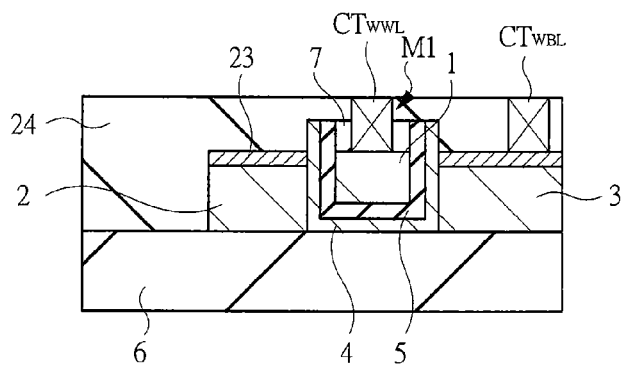
FIG. 11B is a cross-sectional view showing the cross section taken along the line A-A' in FIG. 11A.
Figure 11C:
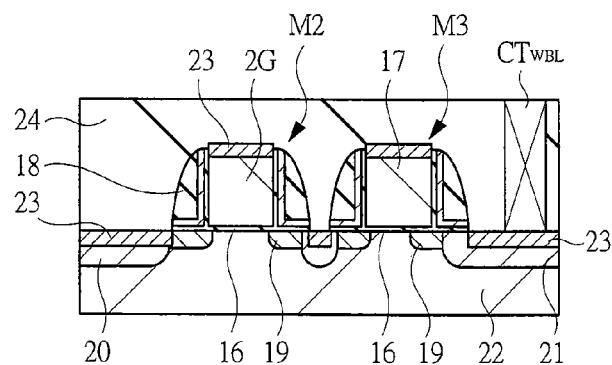
FIG. 11C is a cross-sectional view showing the cross section taken along the line B-B' in FIG. 11A.

First, the structure of the semiconductor device according to the second embodiment will be described with reference to FIG. 11. FIG. 11A is a top view, FIG. 11B is a cross-sectional view showing the cross section taken along the line A-A' in FIG. 11A, and FIG. 11C is a cross-sectional view showing the cross section taken along the line B-B' in FIG. 11A. Note that, in the top view in FIG. 11A, the illustration of the silicide film 23 and the interlayer insulator 24 is omitted so as to make the positional relations of the respective components easily understood.

The structure of the thin-film transistor is basically identical to that of the first embodiment. The write transistor M1 comprised of the thin-film transistor is formed on an isolation region to be the insulator layer 6 and the source 2 of the write transistor M1 is connected to the gate 2G of the storage transistor M2. Further, a write word contact $CT_{WWL}$ and a write bit line contact $CT_{WBL}$ are connected to the gate 1 and the drain 3 of the write transistor M1, respectively.

Next, the structure of the read transistor M2 and the select transistor M3 will be described. Further, the structure of a logic transistor and a high-withstand-voltage transistor in a peripheral circuit (not shown) may also be described. Note that these transistors are MIS transistors which have the structure different from that of the write transistor M1 comprised of the thin-film transistor and are formed on a substrate made of p type silicon. Also, the so-called triple-well structure in which an n well is provided on a substrate and a p well is formed inside the n well can be adopted. When the triple-well structure is adopted, the p wells each isolated by the n well can be set to different voltages, and the bias can be applied to the substrate.

The gate insulators of these transistors are made of, for example, silicon oxide films which have been subjected to the nitriding treatment, and these gate insulators are provided to have two levels of thickness, that is, about 2 nm and about 7 nm. More specifically, the gate insulators 16 of the storage transistor M2, the select transistor M3 and the high-withstand-voltage transistor are designed to have a thickness of about 7 nm, and the gate insulator of the logic transistor is designed to have a thickness of about 2 nm.

The gate 2G of the storage transistor M2 and the gate 17 of the select transistor M3 are made of, for example, a polysilicon film and have sidewalls 18 made of a stacked layer of a silicon oxide film and a silicon nitride film.

In the storage transistor M2 and the select transistor M3 mentioned here, the resistance of the surfaces of the gate 2G, the gate 17 and the source and the drain is reduced by a silicide film 23 made of, for example, nickel silicide. Further, the resistance of the surfaces of the source 2 and the drain 3 of the write transistor M1 is also reduced by the silicide film 23 made of, for example, nickel silicide. Note that, in the top view of FIG. 1A, the illustration of the silicide film 23 is omitted so as to make the positional relations of the respective components easily understood.

Also, the gates of the high-withstand-voltage transistor and the logic transistor are made of, for example, a polysilicon film and have sidewalls made of a silicon oxide film and a silicon nitride film. Also, the gate of the logic transistor is made of a polysilicon film having a surface whose resistance is reduced by, for example, nickel silicide. Similarly, the resistance of the surface of the active region is also reduced by, for example, nickel silicide. Note that, as shown in FIG. 11, the source 2 of the write transistor M1 and the gate 2G of the storage transistor M2 are simultaneously formed and are electrically connected to each other.

Also, shallow $n^-$ regions, that is, so-called extension regions 19 are provided below the sidewalls 18 of the gate 2G of the storage transistor M2 and the gate 17 of the select transistor M3. Further, $n^+$ regions to be a source 20 of the storage transistor M2 and a drain 21 of the select transistor M3 are provided outside the sidewalls 18. In addition, a source line contact $CT_{SL}$ is connected to the source 20 of the storage transistor M2 and a read bit line contact $CT_{RBL}$ is connected to the drain 21 of the select transistor M3.

When both the logic transistor and the high-withstand-voltage transistor have extension regions, it is preferable that the logic transistor uses a shallower extension region compared with the high-withstand-voltage transistor. This is because the extension regions of the logic transistor are formed by performing low-energy impurity implantation or impurity diffusion from a surface, and it is required to form the extension structure whose impurity diffusion in lateral and longitudinal directions is restricted and which is resistant to the short-channel effect even with a short gate length. On the other hand, in the high-withstand-voltage transistor, it is preferable that the impurity implantation with higher energy is performed to form the extension regions deeply extending in lateral and longitudinal directions. This is because it is required to ensure the sufficient withstand voltage of the PN junction.

As shown in FIG. 11, the storage transistor M2 and the select transistor M3 are formed on a p well 22 directly connected to a substrate made of, for example, p type silicon. The gate 2G of the storage transistor M2 is electrically connected to the source 2 of the write transistor M1, so that the charge storage capacitor consisting primarily of the gate capacitance of the storage transistor M2 is formed.

Figure 12A:
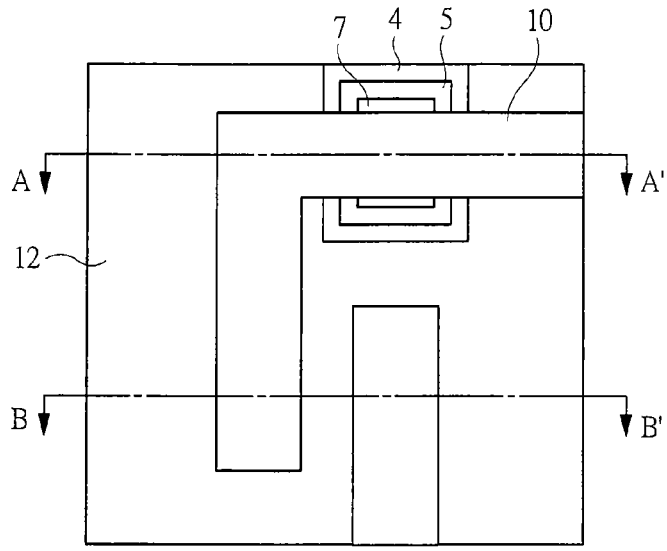
FIG. 12A is a top view showing a fabrication process of a semiconductor device according to the second embodiment of the present invention.
Figure 12B:
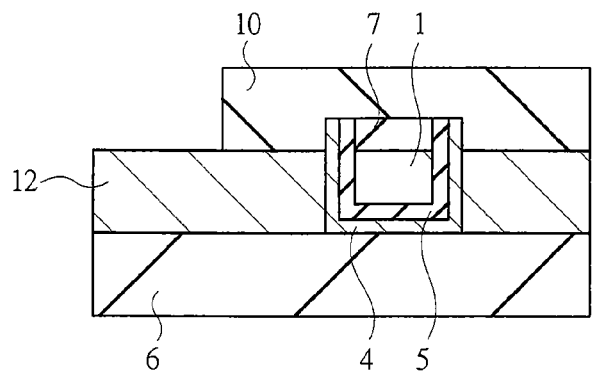
FIG. 12B is a cross-sectional view showing the cross section taken along the line A-A' in FIG. 12A.
Figure 12C:
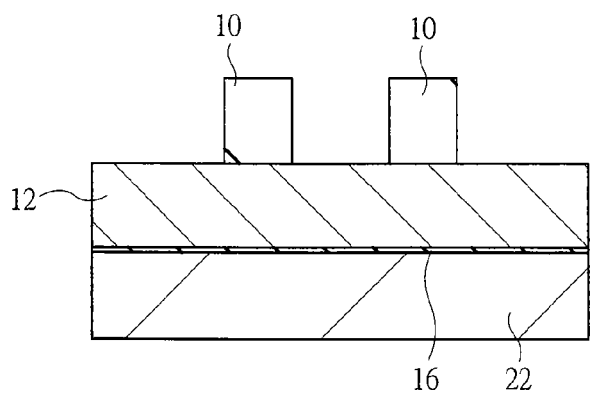
FIG. 12C is a cross-sectional view showing the cross section taken along the line B-B' in FIG. 12A.
Figure 13A:
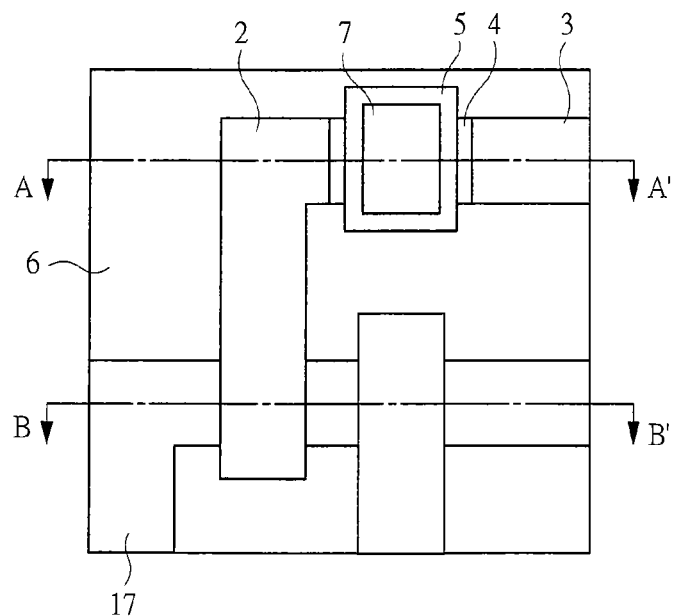
FIG. 13A is a top view showing the fabrication process of a semiconductor device continued from FIG. 12A.
Figure 13B:
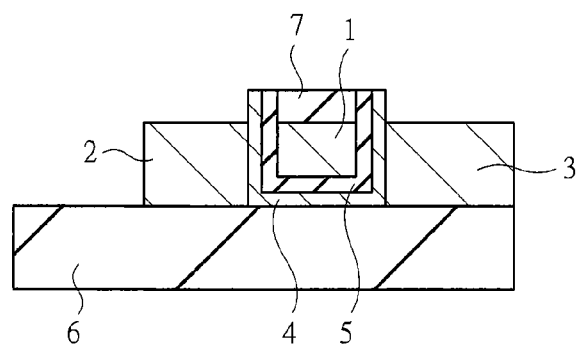
FIG. 13B is a cross-sectional view showing the fabrication process of a semiconductor device continued from FIG. 12B.
Figure 13C:
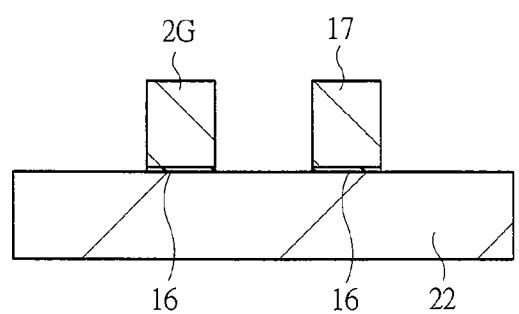
FIG. 13C is a cross-sectional view showing the fabrication process of a semiconductor device continued from FIG. 12C.
Figure 14A:
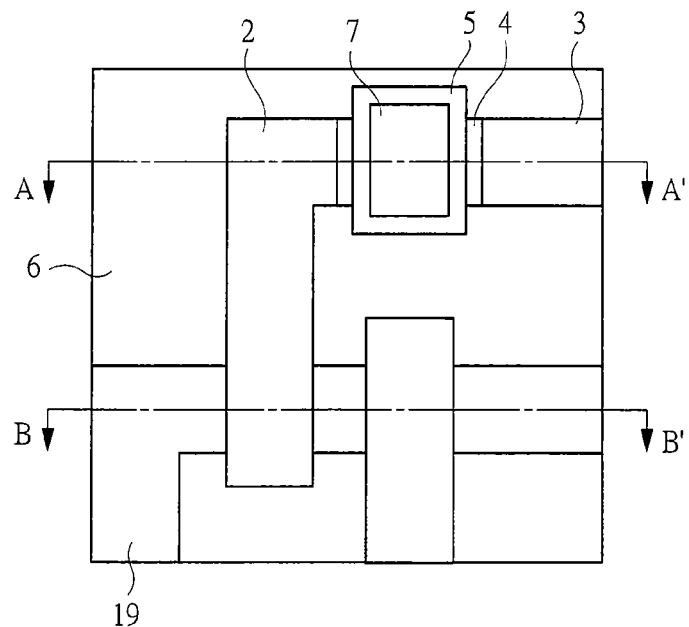
FIG. 14A is a top view showing the fabrication process of a semiconductor device continued from FIG. 13A.
Figure 14B:
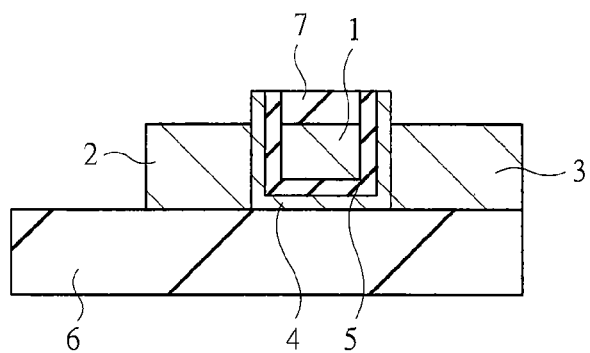
FIG. 14B is a cross-sectional view showing the fabrication process of a semiconductor device continued from FIG. 13B.
Figure 14C:
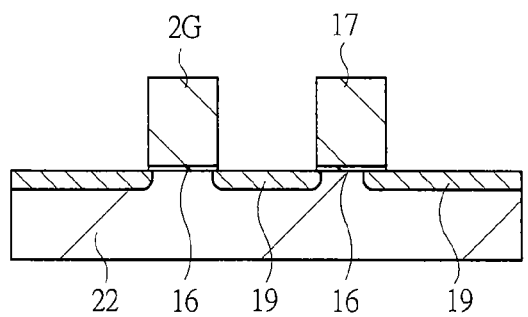
FIG. 14C is a cross-sectional view showing the fabrication process of a semiconductor device continued from FIG. 13C.

Next, the fabrication process of a semiconductor device according to the second embodiment will be described. FIG. 12 to FIG. 14 are top views and cross-sectional views in each step for fabricating the memory according to the second embodiment. In FIG. 12 to FIG. 14, FIG. 12A to FIG. 14A are top views, FIG. 12B to FIG. 14B are cross-sectional views showing the cross sections taken along the line A-A' in FIG. 12A to FIG. 14A, and FIG. 12C to FIG. 14C are cross-sectional views showing the cross sections taken along the line B-B' in FIG. 12A to FIG. 14A.

Note that, in order to avoid the complication in the description, only the positions of the main components in the corresponding step are shown in the top views, and thus, the top views do not represent the accurate top views. Further, each of the cross-sectional views illustrates the upper structure above the p well formed on the surface of the semiconductor substrate on which the semiconductor device is to be formed.

First, a semiconductor substrate made of, for example, p type single crystal silicon (Si) (at this step, a semiconductor plate having a planar and substantially circular shape called a semiconductor wafer) is prepared, a silicon oxide ($SiO_2$) film is formed on a main surface of the semiconductor substrate (hereinafter, referred to as a substrate) by oxidation treatment, and then, a silicon nitride (SiN) film is further deposited.

Subsequently, the silicon nitride film, the silicon oxide film and the substrate are etched using a resist as a mask to form trenches in the substrate. Then, the trenches are filled with a silicon oxide film deposited by CVD, and the silicon oxide film is planarized, thereby forming an isolation region (insulator layer) and an active region in the substrate. Next, impurities are ion-implanted into the active region to form an n well and a p well, and impurities are ion-implanted into the n well to form a p well. For example, as shown in FIG. 12, the insulator layer 6 is formed in the isolation region and the p well 22 is formed in the active region.

After the sacrificial oxidation of the substrate surface, impurity ions for controlling the threshold voltage are implanted using a resist as a mask. After the cleaning, the silicon substrate surface is oxidized to form a gate insulator with a thickness of 7 nm for a peripheral circuit. Next, the silicon oxide film is etched using the resist pattern having an opening for a transistor of the logic circuit as a mask region. At this time, the storage transistor M2 and the select transistor M3 of the memory portion are covered with a resist mask, and the silicon oxide film is not etched.

Then, after removing the resist film, the surface of the silicon substrate is oxidized to 2 nm, thereby forming a gate insulator for the logic circuit. After increasing the dielectric constant by nitriding the surface of the gate insulator, the source-drain material film 12 made of a non-doped polysilicon film for the gate electrode is deposited to, for example, 150 nm.

The process common to the logic transistor and the high-withstand-voltage transistor which form various circuits on a substrate has been described so far. Subsequently, only the process for the thin-film transistor corresponding to the write transistor M1 on the isolation region (insulator layer 6) will be described below. Since the process of forming the thin-film transistor to be the write transistor M1 is identical to that of the first embodiment shown in FIG. 2 to FIG. 9, the description will be made with reference to FIG. 2 to FIG. 9.

As shown in FIG. 2, after the source-drain material film 12 is deposited on the insulator layer 6 and the stopper layer 9 made of a silicon nitride film with a thickness of about 50 nm is deposited further thereon, the etching using a hole pattern of a resist as a mask is performed to remove the source-drain material film 12 in the channel and gate region, thereby forming the opening portion 13.

Subsequently, after cleaning the substrate, as shown in FIG. 3, the channel 4 made of an amorphous silicon film (semiconductor film) with a thickness of about 2.5 nm, the gate insulator 5 with a thickness of about 15 nm and the gate material film 14 made of an n type polysilicon film with a thickness of about 200 nm are deposited. Further, by performing the annealing, the amorphous silicon film of the channel 4 is crystallized to be a polysilicon film.

Note that the unique examination by the inventors of the present invention has revealed that the temperature higher than the temperature for forming the thickness of about 10 nm or more is necessary for the crystallization of the ultra-thin film as described above. Also, since impurities are not implanted into the source-drain material film 12 to be the source and the drain of the thin-film transistor at this annealing step and the diffusion layers of the logic transistor and the high-withstand-voltage transistor are not formed yet, no adverse effect is given to the short-channel characteristics of the thin-film transistor, the logic transistor and the high-withstand-voltage transistor.

Subsequently, as shown in FIG. 4, the gate material film 14 is removed by CMP or etching back, and the removal is stopped when the surface of the stopper layer 9 is exposed. By this means, the gate material film 14 made of an n type polysilicon film is left only in the opening portion 13 of the hole pattern formed previously.

Next, as shown in FIG. 5, the gate material film 14 is etched back to be recessed below the surface of the stopper layer 9, thereby controlling the height thereof to a desired one. The left gate material film 14 becomes the gate 1 of the thin-film transistor.

If there is a difference in level between the isolation region and the active region in the substrate, the gate material film 14 may be left on the stopper layer 9 in the lower-level region in the step of removing the gate material film 14 described with reference to FIG. 4. In such a case, by additionally performing the etching corresponding to the difference in level in the step of etching back the gate material film 14, the film left on the stopper layer 9 can be removed.

Subsequently, as shown in FIG. 6, after the cap film 7 made of, for example, a silicon oxide film with a thickness of about 100 nm is deposited, the cap film 7 is removed by CMP and the removal is stopped when the surface of the stopper layer 9 is exposed.

If there is a difference in level between the isolation region and the active region in the substrate, the cap film 7 may be left on the stopper layer 9 in the lower-level region. When the isolation region is the upper-level region, the etching using a resist covering the region of the opening portion 13 as a mask is performed to remove the left part of the cap film 7. Also, when the isolation region is the lower-level region, since the cap film 7 is left on the opening portion 13, a resist mask is not required and the cap film 7 of the level-difference region is removed by performing the etching back to the whole surface of the substrate.

Then, as shown in FIG. 7, the stopper layer 9 is removed by etching. At this time, the gate 1 is protected by the cap film 7. In this case, the silicon nitride film is etched more in accordance with difference in the etching selectivity ratio between a silicon oxide film and a silicon nitride film.

Only the process for the thin-film transistor to be the write transistor M1 has been described so far. Subsequently, the process common to the storage transistor M2 and the select transistor M3, and the logic transistor and the high-withstand-voltage transistor which form various circuits on a substrate will be described below.

With using a resist as a mask, respective impurities are implanted into the polysilicon film in the region to be an n type gate and in the region to be a p type gate. Note that, since the source 2 and the drain 3 of the thin-film transistor, the gate 2G of the storage transistor and the gate 17 of the select transistor are formed to be an n type, an n type impurity is implanted thereto.

Subsequently, the polysilicon film is etched using a resist as a mask, thereby forming the gate patterns of the logic transistor, the high-withstand-voltage transistor, the storage transistor M2 and the select transistor M3. At this time, for example, with using the mask layer 10 made of a resist as shown in FIG. 12, the source 2 and the drain 3 of the thin-film transistor to be the write transistor M1 are simultaneously formed from the source-drain material film 12 as shown in FIG. 13. At this time, since the gate 1 of the thin-film transistor is covered with the cap film 7 made of a silicon oxide film, the gate 1 is not removed.

Subsequently, an extension of the high-withstand-voltage transistor is formed. First, for the extension of the n type MIS transistor of the high-withstand-voltage transistor, an n type impurity such as phosphorus (P) is implanted at about 10 keV using a resist as a mask. Then, for the extension of the p type MIS transistor of the high-withstand-voltage transistor, a p type impurity such as $BF_2$ is implanted at about 5 keV using a resist as a mask.

Subsequently, as shown in FIG. 14, extension regions 19 of the logic transistor, the storage transistor M2 and the select transistor M3 are formed. First, for the extensions of the n type MIS transistors thereof, an n type impurity such as arsenic (As) is implanted at about 3 keV using a resist pattern, which covers the high-withstand-voltage portion and the p type MIS transistor portion, as a mask. Then, in order to prevent the punch through, the p well concentration below the extension is increased by implanting a p type impurity to a deeper portion. Next, for the formation of the extension of the p type MIS transistor of the logic transistor, a p type impurity such as $BF_2$ is implanted at about 3 keV. Then, in order to prevent the punch through, the n well concentration below the extension is increased by implanting an n type impurity to a deeper portion.

Subsequently, after forming a silicon oxide film by CVD, a silicon nitride film is deposited. Further, after depositing a silicon oxide film by CVD, the etching back is performed to form the sidewalls 18 on the side surfaces of the gate of the logic transistor, the gate of the high-withstand-voltage transistor, the gate 2G of the storage transistor M2 and the gate 17 of the select transistor M3 (see, FIG. 11).

Although the sidewalls are not illustrated for the gate 1, the source 2 and the drain 3 of the thin-film transistor to be the write transistor M1 in FIG. 11, the sidewalls are simultaneously formed for the thin-film transistor. However, since the layer provided below the thin-film transistor is the insulator layer 6 and the sidewalls do not relate to the impurity implantation, the illustration of the sidewalls is omitted in order to avoid the complication in the description of the device structure.

Then, with using the sidewall 18 and a resist as a mask, an n type impurity is implanted to an n type MIS transistor region and a p type impurity is implanted to a p type MIS transistor region, thereby forming diffusion layers 20 and 21 (see, FIG. 11). As the impurity implantation for the diffusion layers 20 and 21, the implantation process common to the logic transistor and the high-withstand-voltage transistor is used. By this means, the source 20 and the drain (common to the source of the select transistor M3) of the storage transistor M2 and the drain 21 and the source of the select transistor M3 are formed.

Subsequently, the silicide film 23 is formed on the surfaces of the gate, the drain and the source of the storage transistor M2, the select transistor M3, the logic transistor and the high-withstand-voltage transistor and on the surfaces of the source 2 and the drain 3 of the write transistor M1 (see, FIG. 11). First, after a silicon oxide film is deposited by CVD, the silicon oxide film is removed using a resist pattern, which covers a portion not to be silicided such as a polysilicon film resistor element, as a mask. Then, a nickel (Ni) film is deposited by sputtering and is reacted with a silicon film by performing annealing, and thereafter, the nickel film is removed. In this manner, the silicide film 23 is formed.

At this time, since the gate 1 of the write transistor M1 comprised of a thin-film transistor is covered with the cap film 7, the short circuit between the gate 1 and the source 2 and between the gate 1 and the drain 3 due to the bridging of the silicide film 23 does not occur.

Figure 15A:
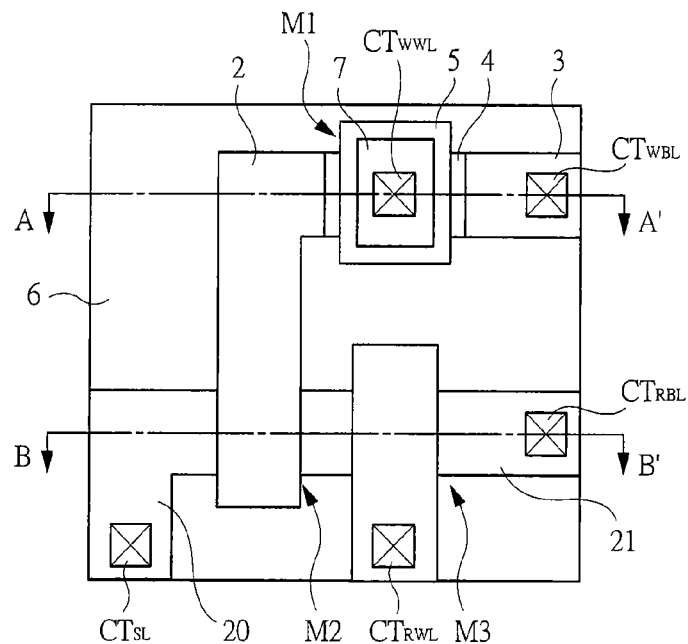
FIG. 15A is a top view showing another example of a semiconductor device according to the second embodiment of the present invention.
Figure 15B:
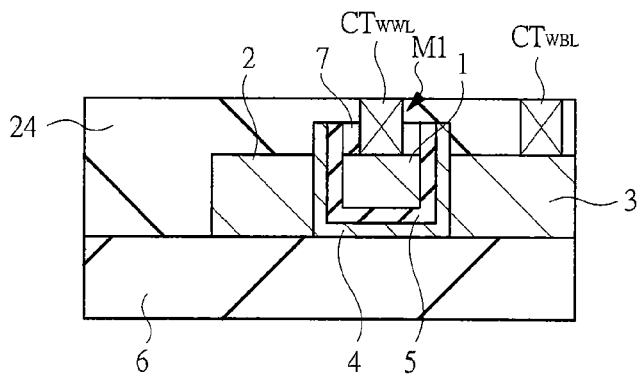
FIG. 15B is a cross-sectional view showing the cross section taken along the line A-A' in FIG. 15A.
Figure 15C:
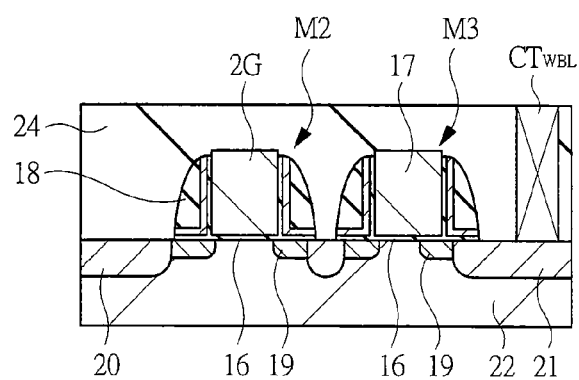
FIG. 15C is a cross-sectional view showing the cross section taken along the line B-B' in FIG. 15A.

Incidentally, there may be the case where the whole of the memory cell portion including the thin-film transistor is not silicided. In this case, the semiconductor device has the structure as shown in FIG. 15. FIG. 15A is a top view, FIG. 15B is a cross-sectional view showing the cross section taken along the line A-A' in FIG. 15A, and FIG. 15C is a cross-sectional view showing the cross section taken along the line B-B' in FIG. 15A. Note that, in the top view in FIG. 15A, the illustration of the interlayer insulator 24 is omitted so as to make the positional relations of the respective components easily understood.

The fabrication process as described above has the characteristics that, even when the cap film 7 on the gate 1 of the write transistor M1 comprised of the thin-film transistor is removed in the subsequent process and the gate 1 made of a polysilicon film is exposed, the short circuit with the source 2 and the drain 3 made of a nickel film does not occur.

Thereafter, the step of depositing and planarizing the interlayer insulator 24 made of, for example, a silicon oxide film, the step of forming contacts such as a write word line contact $CT_{WWL}$ and the step of forming the wirings are performed, whereby the semiconductor device as shown in FIG. 11 is completed.

As described above, by adding the processes and at most two photomasks in the course of fabricating a logic transistor and a high-withstand-voltage transistor on a semiconductor substrate, the thin-film transistor having the channel 4 whose thickness is different from those of the source 2 and the drain 3 can be mounted together, and the memory having the gain cell structure can be formed.

In the second embodiment, a semiconductor substrate made of a p type silicon film is adopted as a substrate. However, a substrate having the SOI structure can also be adopted. When the substrate having the SOI structure is adopted, the characteristics of the logic transistor are improved and a higher-speed and low-power-consumption LSI (large scale integration) can be realized. Further, since the process for the triple well structure becomes unnecessary, the process can be simplified.

Also, in the second embodiment, a polysilicon film whose surface is silicided is used for the gates of the logic transistor and the high-withstand-voltage transistor, and a silicon oxide film whose surface is nitrided is used for the gate insulator. However, even in the case where metal is used for the gate and a high dielectric constant film such as hafnium oxide and alumina is used for the gate insulator, the above-described combination of the diffusion layer structure and the gate insulator remains effective. The relationship in thickness of the gate insulator in this case should be interpreted by replacing the thickness with an electrically equivalent oxide thickness instead of the physical thickness. For example, when there are both a gate insulator made of a high dielectric constant film and a gate insulator made of a silicon oxide film, the high dielectric constant film is converted to the thickness of a silicon oxide film providing an equal static capacitance based on the dielectric constant of the high dielectric constant film. Then, if the converted thickness is smaller than that of the silicon oxide film, the high dielectric constant film can be interpreted as a thin gate insulator. In this manner, the relationship described in this embodiment remains effective without any modification.

Also, in the second embodiment, the gate insulators of the storage transistor M2 and the select transistor M3 of the memory portion are designed to have the thickness equal to that of the gate insulator of the high-withstand-voltage transistor. However, in order to improve the performance of the transistor of the memory portion, the so-called three-level specification can be formed by separately designing gate insulators each having different thicknesses.

Also, in the second embodiment, the extension regions 19 of the storage transistor M2 and the select transistor M3 of a memory portion are formed simultaneously with those of the logic transistor. However, in order to improve the performance of the transistor of the memory portion, the extension regions 19 of the storage transistor M2 and the select transistor M3 can be formed separately from those of the logic transistor by using another mask.

Third Embodiment

Figure 16A:
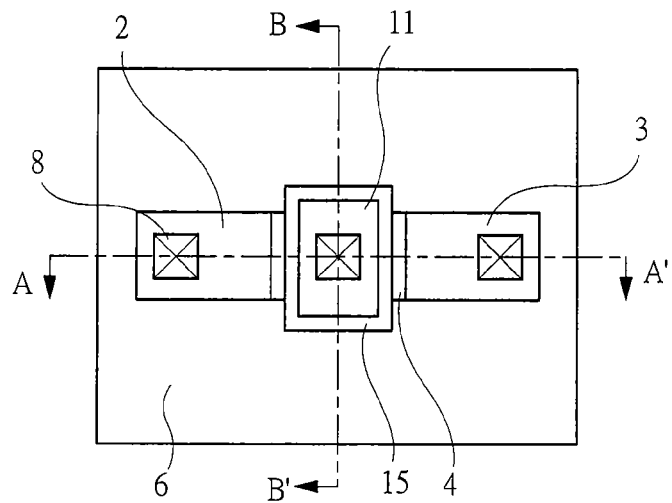
FIG. 16A is a top view showing an example of a semiconductor device according to the third embodiment of the present invention.
Figure 16B:
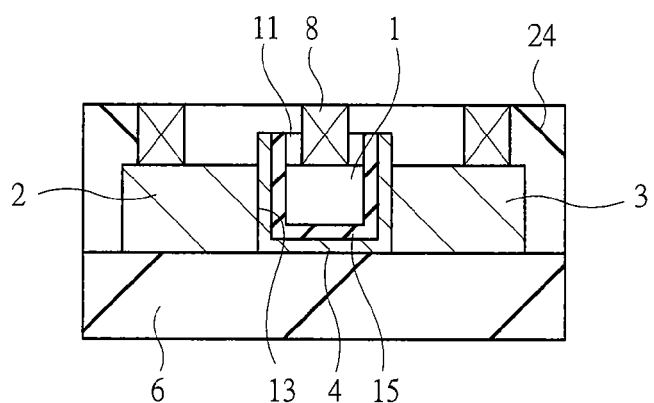
FIG. 16B is a cross-sectional view showing the cross section taken along the line A-A' in FIG. 16A.
Figure 16C:
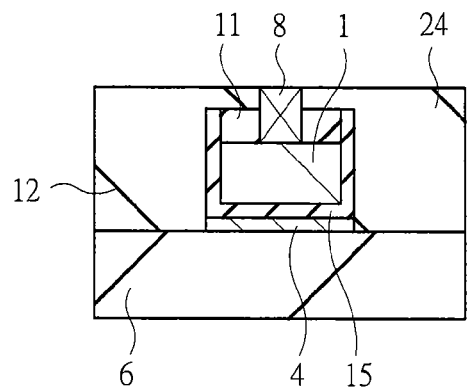
FIG. 16C is a cross-sectional view showing the cross section taken along the line B-B' in FIG. 16A.
Figure 17A:
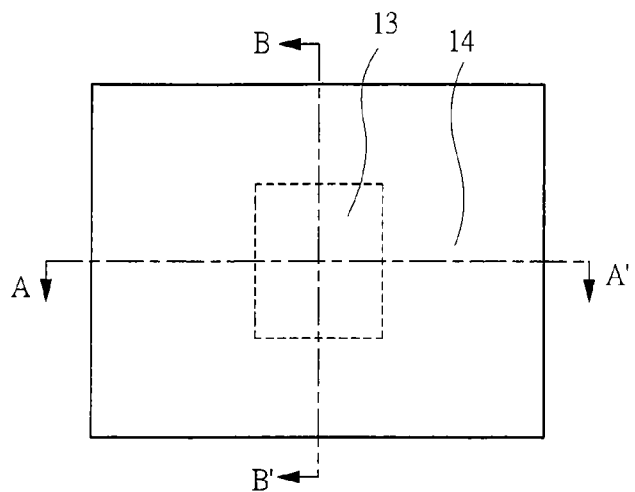
FIG. 17A is a top view showing a fabrication process of a semiconductor device according to the third embodiment of the present invention.
Figure 17B:
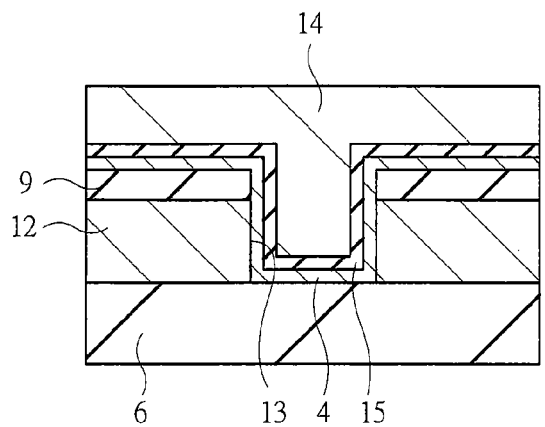
FIG. 17B is a cross-sectional view showing the cross section taken along the line A-A' in FIG. 17A.
Figure 17C:
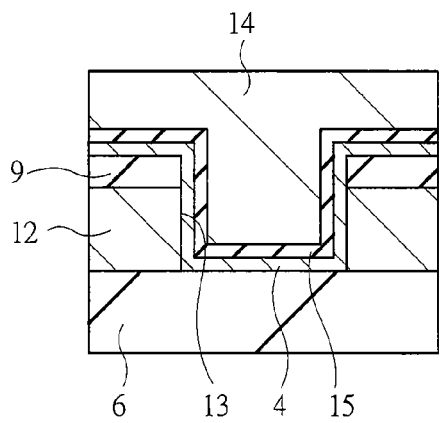
FIG. 17C is a cross-sectional view showing the cross section taken along the line B-B' in FIG. 17A.

In a semiconductor device according to the third embodiment, the structure of the thin-film transistor is basically identical to that of the first embodiment described above. However, the semiconductor device according to the third embodiment is different from that of the first embodiment in that an oxidation-resistant film such as an ONO (oxide nitride oxide) film is used for the gate insulator 15 of the thin-film transistor as shown in FIG. 16. FIG. 16A is a top view, FIG. 16B is a cross-sectional view showing the cross section taken along the line A-A' in FIG. 16A, and FIG. 16C is a cross-sectional view showing the cross section taken along the line B-B' in FIG. 16A. Note that, in the top view in FIG. 16A, the illustration of the interlayer insulator 24 is omitted so as to make the positional relations of the respective components easily understood.

Next, the fabrication process of a semiconductor device according to the third embodiment will be described. FIG. 17 to FIG. 22 are top views and cross-sectional views in each step for fabricating the thin-film transistor according to the third embodiment. In FIG. 17 to FIG. 22, FIG. 17A to FIG. 22A are top views, FIG. 17B to FIG. 22B are cross-sectional views showing the cross sections taken along the line A-A' in FIG. 17A to FIG. 22A, and FIG. 17C to FIG. 22C are cross-sectional views showing the cross sections taken along the line B-B' in FIG. 17A to FIG. 22A.

Note that, in order to avoid the complication in the description, only the positions of the main components in the corresponding step are shown in the top views, and thus, the top views do not represent the accurate top views. Further, each of the cross-sectional views illustrates the upper structure above the insulator layer on which the semiconductor device is to be formed. This insulator layer 6 is, for example, a silicon oxide film formed on a semiconductor substrate or a glass substrate.

First, through the fabrication process similar to that of the first embodiment described with reference to FIG. 2, the source-drain material film 12 and the stopper layer 9 are sequentially formed in this order on the insulator layer 6 of the semiconductor substrate, and then, the opening portion 13 reaching the insulator layer 6 is formed in the stopper film 9 and the source-drain material film 12. The fabrication process of the third embodiment differs from that of the first embodiment in the following process.

Subsequently, as shown in FIG. 17, the channel 4 and the gate insulator 15 having desired thickness are formed in this order on the insulator layer 6 in the opening portion 13 and on the source-drain material film 12 in the opening portion 13. Thereafter, the gate material film 14 is formed on the gate insulator 15 so as to embed the opening portion 13.

More concretely, after cleaning the substrate, the channel 4 made of an amorphous silicon film (semiconductor film) with a thickness of about 2.5 nm, a silicon oxide film (oxide film) with a thickness of about 5 nm as the gate insulator 15, a silicon nitride film (nitride film) with a thickness of about 10 nm, and a silicon oxide film (oxide film) with a thickness of about 5 nm are deposited. Then, the gate material film 14 made of an n type polysilicon film with a thickness of about 200 nm is deposited. Further, by performing the annealing, the amorphous silicon film of the channel 4 is crystallized to be a polysilicon film. As described above, different from the first embodiment, the ONO film having oxidation resistance properties is used for the gate insulator 15 in the third embodiment.

Figure 18A:
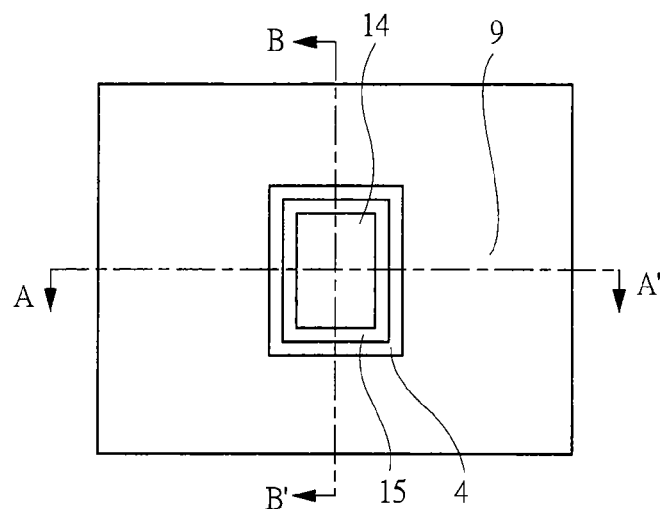
FIG. 18A is a top view showing the fabrication process of a semiconductor device continued from FIG. 17A.
Figure 18B:
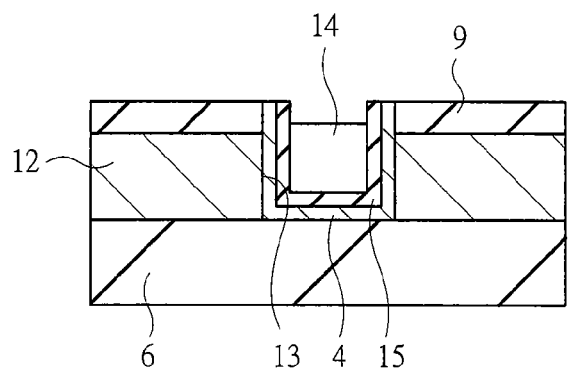
FIG. 18B is a cross-sectional view showing the fabrication process of a semiconductor device continued from FIG. 17B.
Figure 18C:
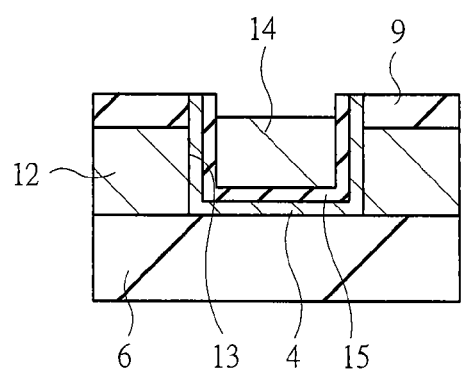
FIG. 18C is a cross-sectional view showing the fabrication process of a semiconductor device continued from FIG. 17C.

Subsequently, as shown in FIG. 18, the gate material film 14 is removed by CMP or etching back, and the removal is stopped when the surface of the stopper layer 9 is exposed. By this means, the gate material film 14 made of an n type polysilicon film is left only in the opening portion 13 of the hole pattern formed previously. Further, the gate material film 14 is etched back to be recessed below the surface of the stopper layer 9, thereby controlling the height thereof to a desired one. However, this etching back is not always necessary.

Figure 19A:
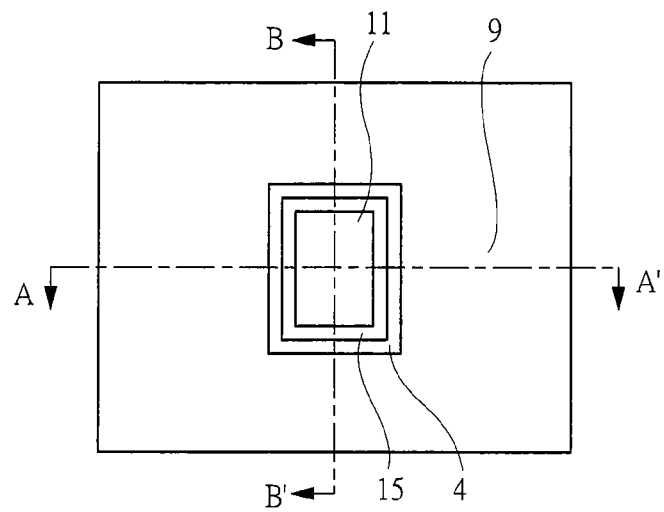
FIG. 19A is a top view showing the fabrication process of a semiconductor device continued from FIG. 18A.
Figure 19B:
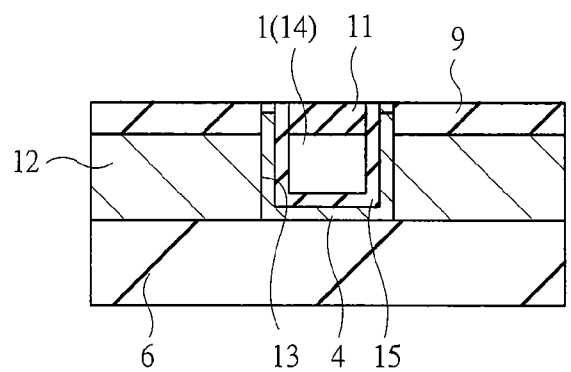
FIG. 19B is a cross-sectional view showing the fabrication process of a semiconductor device continued from FIG. 18B.
Figure 19C:
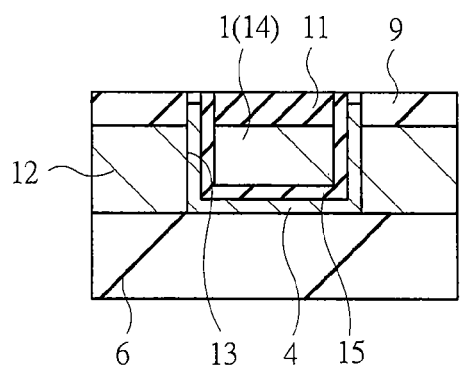
FIG. 19C is a cross-sectional view showing the fabrication process of a semiconductor device continued from FIG. 18C.

Subsequently, as shown in FIG. 19, the cap film 11 is formed on the gate material film 14, thereby forming the gate 1 made of the gate material film.

More concretely, the n type polysilicon film which is the gate material film 14 is oxidized. At this time, the exposed surface of the channel 4 made of a polysilicon film is oxidized together with the exposed surface of the gate material film 14, and the cap film 11 made of a silicon oxide film is formed. On the other hand, the gate material film 14 which is not oxidized becomes the gate 1 of the thin-film transistor.

When the cap film 11 is formed, the surface of the source-drain material film 12 to be the source and the drain is not oxidized because it is protected by the stopper layer 9. Also, since the oxidation rate of the channel 4 whose surface is exposed is slower than that of the gate material film 14 made of an n type polysilicon film implanted with an impurity, the oxidation of the exposed channel 4 is small. Further, since an oxidation-resistant film is used for the gate insulator 15, the channel 4 is not oxidized and broken by the oxidizing species diffused from the side of the n type polysilicon film having a high oxidation rate.

For example, when the gate insulator 15 made of only a silicon oxide film, the channel 4 made of, for example, polysilicon is also oxidized together with the oxidation for forming the cap film 11, and the thickness of the thin channel 4 is further reduced, that is, the channel 4 may be broken. However, in the third embodiment, since an ONO film which is an oxidation-resistant film is used for the gate insulator 15, the channel 4 is not oxidized and broken.

Figure 20A:
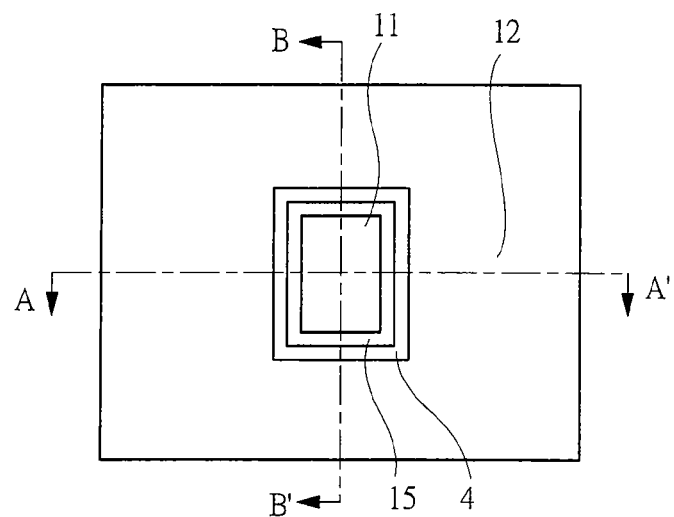
FIG. 20A is a top view showing the fabrication process of a semiconductor device continued from FIG. 19A.
Figure 20B:
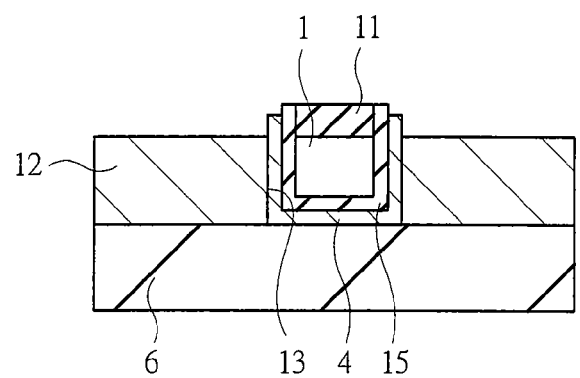
FIG. 20B is a cross-sectional view showing the fabrication process of a semiconductor device continued from FIG. 19B.
Figure 20C:
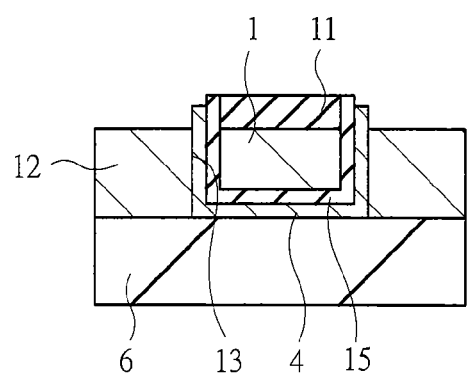
FIG. 20C is a cross-sectional view showing the fabrication process of a semiconductor device continued from FIG. 19C.

Subsequently, as shown in FIG. 20, the stopper layer 9 is removed by etching. The gate 1 is protected by the remaining cap film 11. In this case, a silicon nitride film is etched more in accordance with difference in the etching selectivity ratio between a silicon oxide film and a silicon nitride film.

Next, impurities are implanted into the regions to be n type source and drain and the regions to be p type source and drain of the polysilicon film, with using a resist as a mask. In this case, since the source and drain of the thin-film transistor are formed to be n type, an n type impurity is implanted.

Figure 21A:
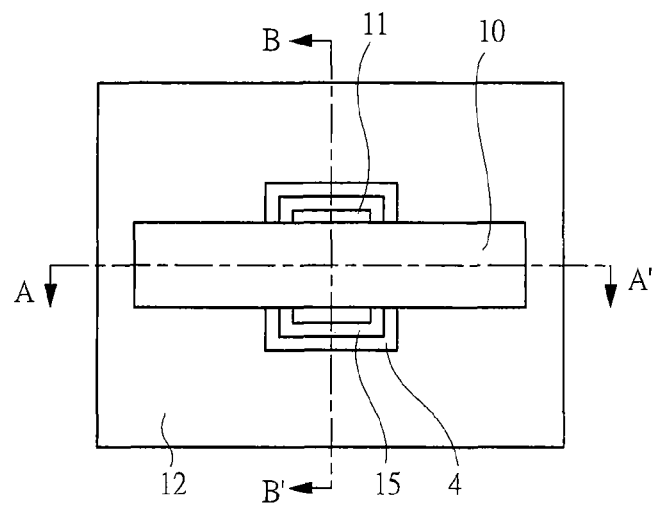
FIG. 21A is a top view showing the fabrication process of a semiconductor device continued from FIG. 20A.
Figure 21B:
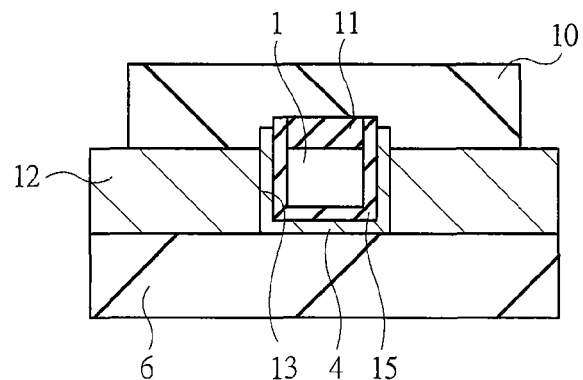
FIG. 21B is a cross-sectional view showing the fabrication process of a semiconductor device continued from FIG. 20B.
Figure 21C:
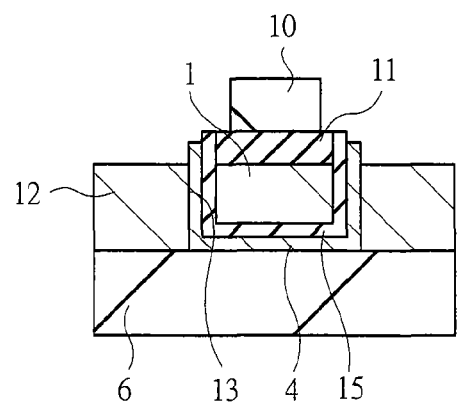
FIG. 21C is a cross-sectional view showing the fabrication process of a semiconductor device continued from FIG. 20C.
Figure 22A:
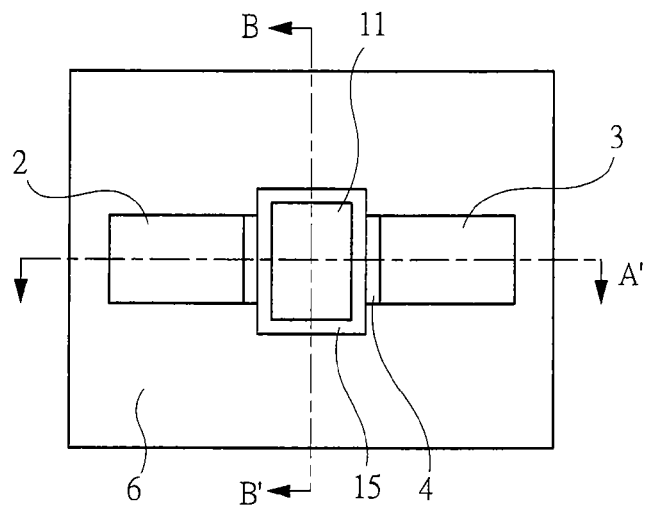
FIG. 22A is a top view showing the fabrication process of a semiconductor device continued from FIG. 21A.
Figure 22B:
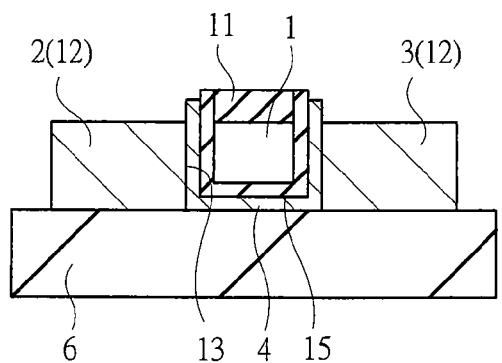
FIG. 22B is a cross-sectional view showing the fabrication process of a semiconductor device continued from FIG. 21B.
Figure 22C:
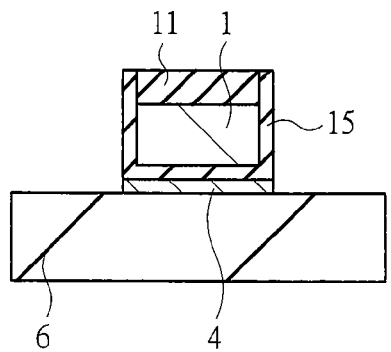
FIG. 22C is a cross-sectional view showing the fabrication process of a semiconductor device continued from FIG. 21C.

Subsequently, as shown in FIG. 21, the mask layer 10 is formed on the gate 1 and the source-drain material film 12 so as to pass across the gate 1.

More concretely, in order to leave the source-drain material film 12 so as to form the source 2 on one side of the gate 1 and the drain 3 on the other side of the gate 1, the mask layer 10 made of resist is formed on the gate 1 and the source-drain material film 12 so as to pass across the gate 1.

Subsequently, while protecting the gate 1 by the cap film 11, the source-drain material film 12 not protected by the mask layer 10 is removed. By this means, as shown in FIG. 22, the source-drain material film 12 is left on both sides of the gate 1.

More concretely, the polysilicon film is etched using a resist as a mask. At this time, for example, with using the mask layer 10 made of a resist as shown in FIG. 21, the source 2 and the drain 3 of the thin-film transistor are simultaneously formed from the source-drain material film 12 as shown in FIG. 22. At this time, since the gate 1 of the thin-film transistor is protected by the cap film 11 made of a silicon oxide film, it is not removed.

Subsequently, the step of depositing and planarizing the interlayer insulator 24 made of, for example, a silicon oxide film, the step of forming contacts 8 and the step of forming the wirings are performed, whereby the semiconductor device as shown in FIG. 16 is completed.

As described above, in the fabrication process of a thin-film transistor according to the third embodiment, since the thickness of the channel 4 can be controlled by means of deposition, it is possible to form the channel 4 thinly. Also, since an oxidation-resistant film is used for the gate insulator 15, the channel 4 is not oxidized and broken by, for example, the oxidation treatment for forming the cap film 11 performed after the formation of the channel 4. Accordingly, the off current of the thin-film transistor can be reduced.

Also, since the thin-film transistor described in the third embodiment has the structure in which the gate 1 is embedded inside the opening portion, unnecessary spaces are not provided between the source 2 and the gate 1 and between the drain 3 and the gate 1. Also, since the contact 8 is formed for the gate 1, it is not necessary to extend the pad, and thus, the size of the element can be reduced.

In the third embodiment, the gate insulator 15 is formed from a silicon oxide film with a thickness of about 5 nm, a silicon nitride film with a thickness of about 10 nm and a silicon oxide film with a thickness of about 5 nm. However, a thinner silicon nitride film can be used as long as it has sufficient oxidation resistance properties. Further, a thinner silicon oxide film can be used as long as it does not increase the interface state on the side in contact with the channel 4 and the leakage current can be reduced to an acceptable level.

Also, in the third embodiment, the so-called ONO film is used for the gate insulator 15. However, other films such as an ON film and a high dielectric constant stacked film of a silicon oxide film and alumina can also be used, and any other materials can be used as long as they do not increase the interface state on the side in contact with the channel 4 and they have sufficient oxidation resistance properties. Further, the threshold value of the thin-film transistor can be changed by a positive fixed charge of a silicon nitride film and a negative fixed charge of a high dielectric constant film. At this time, by changing the thickness of the silicon oxide film between the silicon nitride film or the high dielectric constant film and the channel 4, the amount of change of the threshold value due to the fixed charge can be controlled, and the threshold value can be set to an arbitrary value.

Fourth Embodiment

Figure 23A:
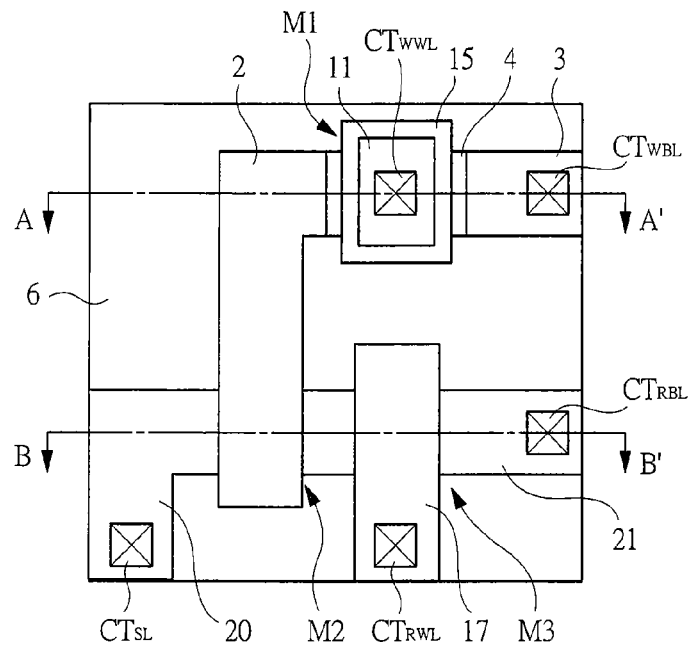
FIG. 23A is a top view showing an example of a semiconductor device according to the fourth embodiment of the present invention.
Figure 23B:
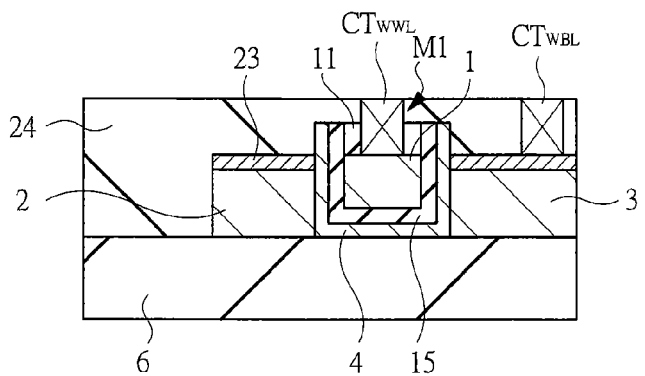
FIG. 23B is a cross-sectional view showing the cross section taken along the line A-A' in FIG. 23A.
Figure 23C:
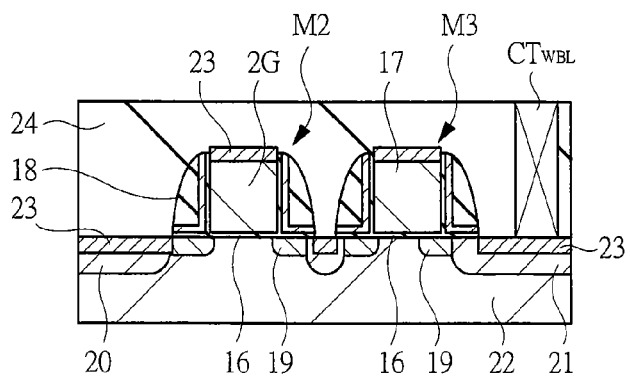
FIG. 23C is a cross-sectional view showing the cross section taken along the line B-B' in FIG. 23A.

In a semiconductor device according to the fourth embodiment, as shown in FIG. 23, the structure of the thin-film transistor is basically identical to that of the third embodiment described above. However, in the fourth embodiment, the thin-film transistor described in the third embodiment is mounted together with a logic transistor and a high-withstand-voltage transistor formed on the same substrate. Note that, in the top view of FIG. 23A, the illustration of the silicide film 23 and the interlayer insulator 24 is omitted so as to make the positional relations of the respective components easily understood.

The write transistor M1 comprised of a thin-film transistor is formed on the isolation region formed of the insulator layer 6, and the storage transistor M2, the select transistor M3, the logic transistor and the high-withstand-voltage transistor are formed on the active region. The source 2 of the write transistor M1 comprised of a thin-film transistor is connected to the gate 2G of the storage transistor M2.

The fabrication process of a semiconductor device according to the fourth embodiment differs in that, in the process of forming the thin-film transistor in the second embodiment, an oxidation-resistant film such as an ONO film is used for the gate insulator 15 of the thin-film transistor and the mask layer is formed by thermal oxidation as described in the third embodiment.

Accordingly, it becomes unnecessary to provide the photomask for removing the etching residue of a mask layer in a lower-level region caused when there is a difference in level between an isolation region and an active region in a substrate and the isolation region is the higher-level region as described in the second embodiment, and thus, the number of masks to be added for mounting the thin-film transistor can be reduced to one.

Fifth Embodiment

Figure 24A:
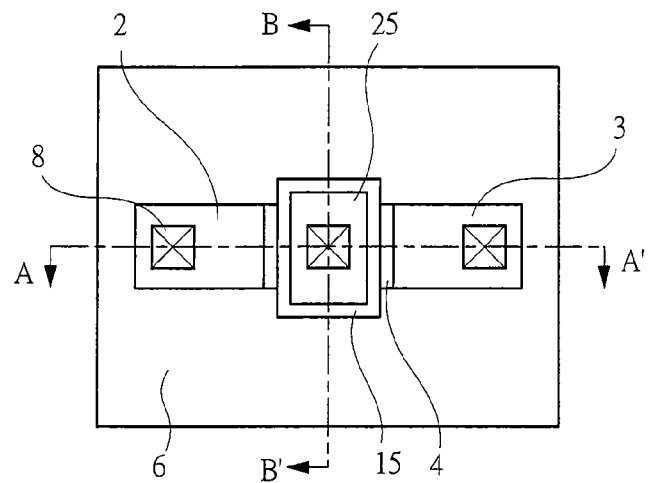
FIG. 24A is a top view showing an example of a semiconductor device according to the fifth embodiment of the present invention.
Figure 24B:
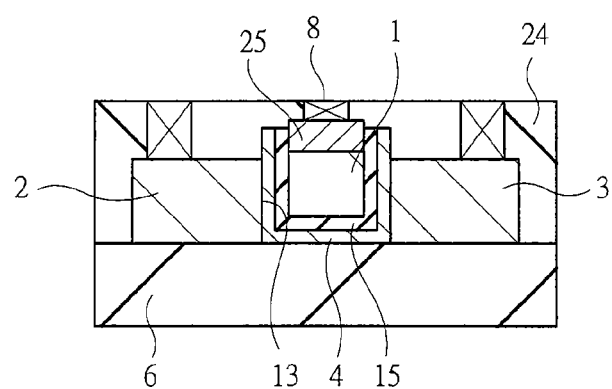
FIG. 24B is a cross-sectional view showing the cross section taken along the line A-A' in FIG. 24A.
Figure 24C:
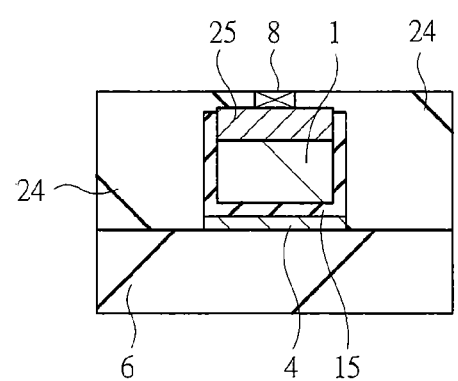
FIG. 24C is a cross-sectional view showing the cross section taken along the line B-B' in FIG. 24A.

FIG. 24 is an explanatory diagram of a thin-film transistor (semiconductor device) according to the fifth embodiment, in which FIG. 24A is a top view, FIG. 24B is a cross-sectional view showing the cross section taken along the line A-A' in FIG. 24A, and FIG. 24C is a cross-sectional view showing the cross section taken along the line B-B' in FIG. 24A. Note that, in the top view in FIG. 24A, the illustration of the interlayer insulator 24 is omitted so as to make the positional relations of the respective components easily understood.

The case where a silicon oxide film formed by deposition is used as the cap film 7 has been described in the first and second embodiments, and the case where a silicon oxide film formed by oxidation is used as the cap film 11 has been described in the third and fourth embodiments. On the other hand, in the fifth embodiment, a silicide film formed by silicidation is used as a cap film 25 as shown in FIG. 24. Note that, since other components constituting the thin-film transistor of the fifth embodiment are identical to those of the first embodiment described above, the description thereof is omitted.

Figure 25A:
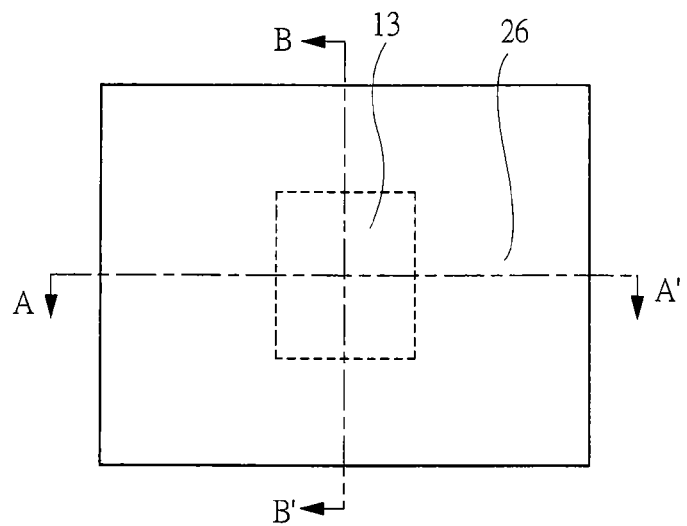
FIG. 25A is a top view showing a fabrication process of a semiconductor device according to the fifth embodiment of the present invention.
Figure 25B:
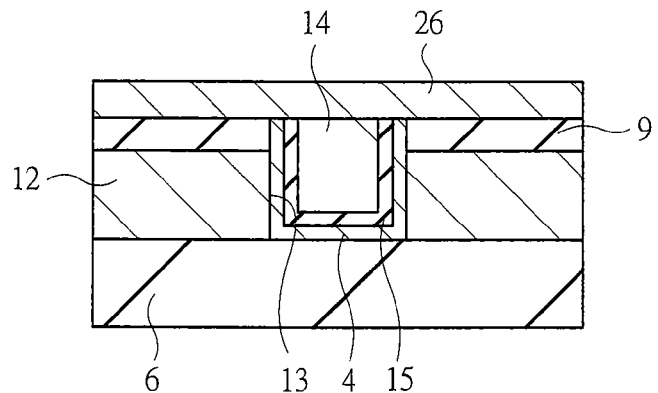
FIG. 25B is a cross-sectional view showing the cross section taken along the line A-A' in FIG. 25A.
Figure 25C:
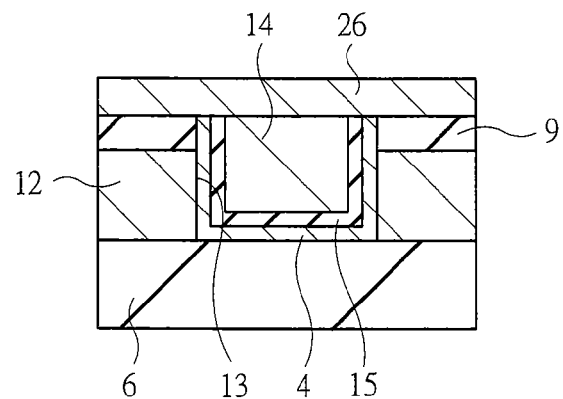
FIG. 25C is a cross-sectional view showing the cross section taken along the line B-B' in FIG. 25A.
Figure 26A:
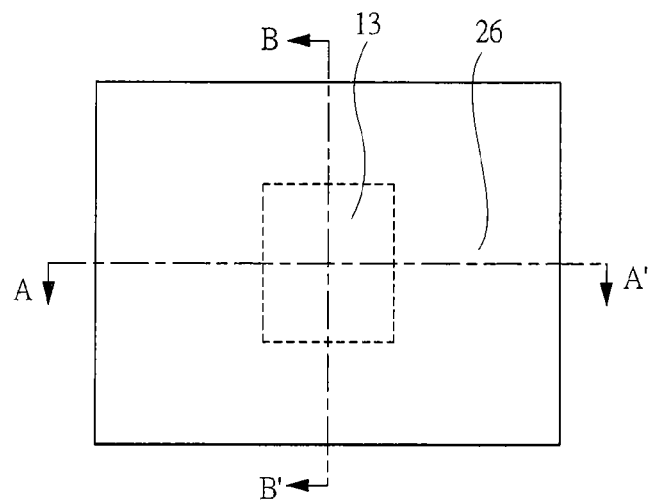
FIG. 26A is a top view showing the fabrication process of a semiconductor device continued from FIG. 25A.
Figure 26B:
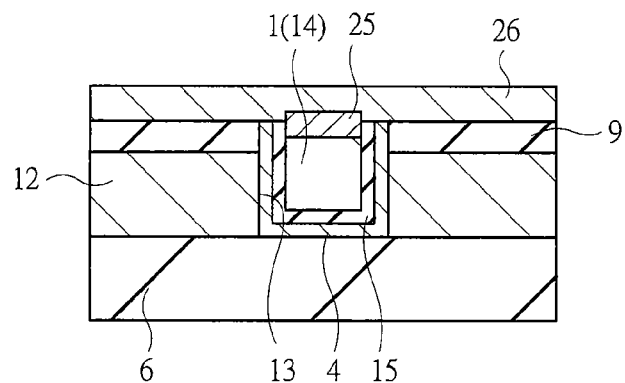
FIG. 26B is a cross-sectional view showing the fabrication process of a semiconductor device continued from FIG. 25B.
Figure 26C:
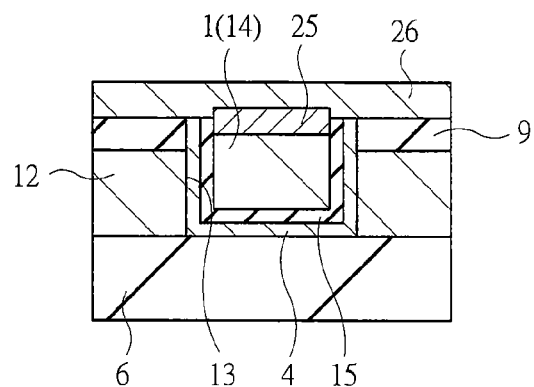
FIG. 26C is a cross-sectional view showing the fabrication process of a semiconductor device continued from FIG. 25C.
Figure 27:
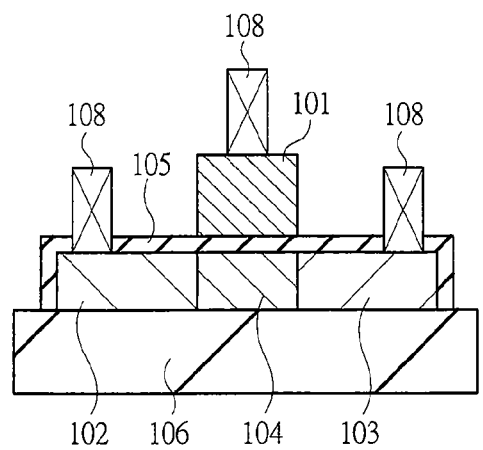
FIG. 27 is a cross-sectional view showing a semiconductor device examined by the inventors of the present invention.
Figure 28:
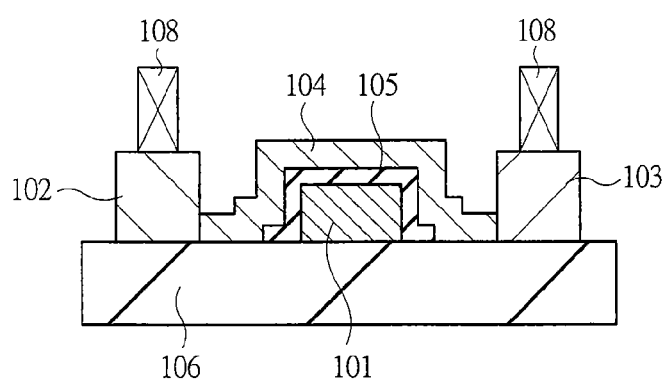
FIG. 28 is a cross-sectional view showing a semiconductor device examined by the inventors of the present invention.
Figure 29:
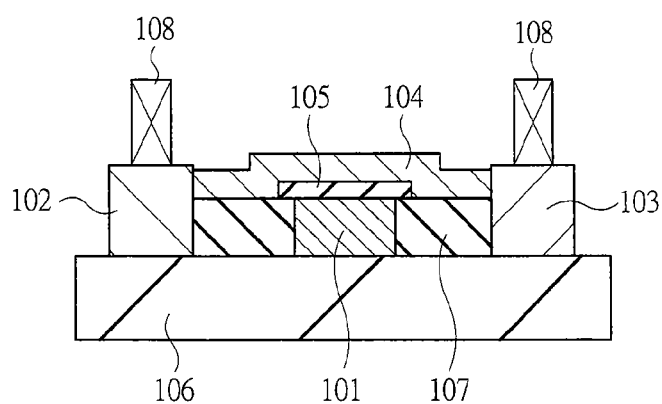
FIG. 29 is a cross-sectional view showing a semiconductor device examined by the inventors of the present invention.

Next, a fabrication process of a thin-film transistor according to the fifth embodiment will be described. FIG. 25 and FIG. 26 are explanatory diagrams in the fabrication process of the thin-film transistor according to the fifth embodiment, in which FIG. 25A and FIG. 26A are top views, FIG. 25B and FIG. 26B are cross-sectional views showing the cross sections taken along the line A-A' in FIG. 25A and FIG. 26A, and FIG. 25C and FIG. 26C are cross-sectional views showing the cross sections taken along the line B-B' in FIG. 25A and FIG. 26A. Note that, in order to avoid the complication in the description, only the positions of the main components in the corresponding step are shown in the top views, and thus, the top views do not represent the accurate top views. Further, each of the cross-sectional views illustrates the upper structure above the insulator layer 6 on which the semiconductor device is to be formed. This insulator layer 6 is, for example, a silicon oxide film formed on a semiconductor substrate or a glass substrate.

First, the fabrication process similar to that described in the first embodiment with reference to FIG. 2 to FIG. 4 is performed.

Subsequently, as shown in FIG. 25, a metal film 26 is formed on the gate material film 14 made of a polysilicon film. This metal film 26 is, for example, a nickel film formed by sputtering. Note that a titanium film or a cobalt film can be used as the metal film 26.

Then, as shown in FIG. 26, the cap film 25 made of a nickel silicide film obtained by the reaction between a polysilicon film of the gate material film 14 and a nickel film of the metal film 26 is formed by annealing. Next, the unreacted metal film 26 is removed. Thereafter, for example, by performing the fabrication process similar to that described in the first embodiment with reference to FIG. 7 to FIG. 9, the thin-film transistor (semiconductor device) is completed.

As described above, in the fabrication process of the thin-film transistor shown in the fifth embodiment, since the thickness of the channel 4 is controlled by means of deposition, it is possible to form the channel 4 thinly. Further, the step by which the channel 4 is broken due to the change in thickness, for example, the oxidation treatment is not included in the fabrication process after the formation of the channel 4. Therefore, the off current of the thin-film transistor can be reduced.

Also, since the thin-film transistor described in the fifth embodiment has the structure in which the gate 1 is embedded inside the opening portion, unnecessary spaces are not provided between the source 2 and the gate 1 and between the drain 3 and the gate 1. Also, since the contact 8 is formed for the gate 1, it is not necessary to extend the pad, and thus, the size of the element can be reduced.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is widely applicable to the industry of fabricating semiconductor devices. In particular, it is utilized for realizing a semiconductor device having a good matching with the process of a logic transistor formed on a semiconductor substrate and provided with a low-cost semiconductor memory.

What is claimed is:

1. A method for fabrication of a semiconductor device, comprising the steps of:
    (a) forming a source-drain material film on an insulator layer;
    (b) forming an opening portion reaching the insulator layer in the source-drain material film;
    (c) forming a semiconductor film on the insulator layer in the opening portion and on the source-drain material film in the opening portion;
    (d) forming a gate insulator on the semiconductor film;
    (e) forming a gate material film embedding the opening portion on the gate insulator;
    (f) forming a cap film on the gate material film, thereby forming a gate made of the gate material film;
    (g) after the step (f), forming a mask layer on the source-drain material film; and
    (h) removing the source-drain material film not protected by the mask layer while protecting the gate by the cap film, thereby leaving the source-drain material film on both sides of the gate.

2. The method for fabrication of a semiconductor device according to claim 1,
    wherein, in the step (c), the semiconductor film made of an amorphous silicon film is formed.

3. The method for fabrication of a semiconductor device according to claim 2,
    wherein, before the step (f), the amorphous silicon film is annealed to crystallize the amorphous silicon film.

4. The method for fabrication of a semiconductor device according to claim 3,
    wherein, in the step (b), the source-drain material film made of a polysilicon film not doped with an impurity is formed, and
    after the annealing treatment and before the step (h), an impurity is implanted to the source-drain material film.

5. The method for fabrication of a semiconductor device according to claim 1,
    wherein, in the step (f), the cap film is formed by deposition.

6. The method for fabrication of a semiconductor device according to claim 1,
    wherein, in the step (d), the gate insulator made of a silicon oxide film is formed, and
    in the step (f), the cap film made of a silicon oxide film deposited by CVD is formed.

7. The method for fabrication of a semiconductor device according to claim 1,
    wherein, in the step (d), the gate insulator including a nitride film is formed,
    in the step (e), the gate material film made of a polysilicon film is formed, and
    in the step (f), the cap film made of a silicon oxide film obtained by oxidizing the polysilicon film is formed.

8. The method for fabrication of a semiconductor device according to claim 1,
    wherein, in the step (e), the gate material film made of a polysilicon film is formed,
    after the step (e), a metal film is formed on the gate material film, and
    in the step (f), the cap film made of a silicide film obtained by reaction between the polysilicon film and the metal film is formed.

* * * * *